(12) United States Patent
Burns et al.

(10) Patent No.: US 7,821,280 B2
(45) Date of Patent: *Oct. 26, 2010

(54) PROCESS MONITOR FOR MONITORING AND COMPENSATING CIRCUIT PERFORMANCE

(75) Inventors: Lawrence M. Burns, Los Altos, CA (US); Leonard Dauphinee, Irvine, CA (US); Ramon A. Gomez, San Juan Capistrano, CA (US); James Y. C. Chang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/110,229

(22) Filed: Apr. 25, 2008

(65) Prior Publication Data

US 2008/0265929 A1 Oct. 30, 2008

Related U.S. Application Data

(63) Continuation of application No. 10/963,639, filed on Oct. 14, 2004, now Pat. No. 7,375,540, which is a continuation-in-part of application No. 10/647,472, filed on Aug. 26, 2003, now Pat. No. 7,449,908, which is a continuation of application No. 10/440,311, filed on May 19, 2003, now Pat. No. 7,309,998.

(60) Provisional application No. 60/430,061, filed on Dec. 2, 2002.

(51) Int. Cl.
*G01R 31/02* (2006.01)
*G01R 31/00* (2006.01)

(52) U.S. Cl. .................... 324/763; 324/765; 324/158.1; 714/721; 714/733

(58) Field of Classification Search ......... 324/754–765; 714/720–738
See application file for complete search history.

(56) References Cited

U.S. PATENT DOCUMENTS 4,159,514 A 6/1979 Kakalec (Continued)

FOREIGN PATENT DOCUMENTS

JP 7-183344 7/1995

OTHER PUBLICATIONS

Allen, P., et al, "CMOS Analog Circuit Design", Saunders College Publishing, 1987, pp. 58-66 and 76-86.

(Continued)

*Primary Examiner*—Ha Tran T Nguyen
*Assistant Examiner*—Emily Y Chan
(74) *Attorney, Agent, or Firm*—Sterne, Kessler, Goldstein & Fox P.L.L.C.

(57) ABSTRACT

A method and system for monitoring and compensating the performance of an operational circuit is provided. The system includes one or more integrated circuit chips and a controller. Each integrated circuit chip includes one or more operational circuits, each operational circuit having at least one controllable circuit parameter. Each integrated circuit chip also includes a process monitor module at least partially constructed thereon. The controller is coupled to each process monitor module and to each operational circuit. The controller includes logic for evaluating the performance of an operational circuit based on data obtained from process monitor module and operational circuit related data stored in a memory. Based on the evaluation, the controller determines whether any deviations from desired or optimal performance of the circuit exist. If deviations exist, the controller generates a control signal to initiate adjustments to the operational circuit to compensate for the deviations.

9 Claims, 14 Drawing Sheets

U.S. PATENT DOCUMENTS

| | | | |
|---|---|---|---|
| 4,354,216 A | 10/1982 | Volta | |
| 4,796,142 A | 1/1989 | Libert | |
| 5,363,048 A * | 11/1994 | Modlin et al. | 324/519 |
| 5,621,355 A | 4/1997 | Williams et al. | |
| 5,764,655 A | 6/1998 | Kirihata et al. | |
| 5,774,319 A | 6/1998 | Carter et al. | |
| 5,781,766 A * | 7/1998 | Davis | 713/401 |
| 5,831,446 A | 11/1998 | So et al. | |
| 6,002,356 A | 12/1999 | Cooper | |
| 6,040,737 A | 3/2000 | Ranjan et al. | |
| 6,088,806 A | 7/2000 | Chee | |
| 6,154,715 A | 11/2000 | Dinteman et al. | |
| 6,163,862 A | 12/2000 | Adams et al. | |
| 6,239,603 B1 | 5/2001 | Ukei et al. | |
| 6,357,025 B1 | 3/2002 | Tuttle | |
| 6,369,618 B1 | 4/2002 | Bloodworth et al. | |
| 6,476,593 B1 * | 11/2002 | Schmal et al. | 324/76.24 |
| 6,535,013 B2 | 3/2003 | Samaan | |
| 6,577,196 B2 | 6/2003 | Hart | |
| 6,600,374 B2 | 7/2003 | Nguyen et al. | |
| 6,714,036 B2 | 3/2004 | Figueras et al. | |
| 6,727,759 B2 | 4/2004 | Nguyen et al. | |
| 6,769,081 B1 | 7/2004 | Parulkar | |
| 6,785,626 B2 | 8/2004 | Corr | |
| 6,853,177 B2 * | 2/2005 | Shibayama et al. | 324/76.48 |
| 6,853,315 B2 | 2/2005 | Schiller et al. | |
| 6,894,501 B1 * | 5/2005 | Flasck et al. | 324/416 |
| 2002/0160711 A1 | 10/2002 | Carlson et al. | |
| 2003/0034838 A1 | 2/2003 | Fanous et al. | |
| 2004/0105033 A1 | 6/2004 | Dauphinee et al. | |
| 2004/0108866 A1 | 6/2004 | Burns et al. | |
| 2004/0166799 A1 | 8/2004 | Kral | |
| 2005/0062491 A1 | 3/2005 | Burns et al. | |
| 2005/0130617 A1 | 6/2005 | Burns et al. | |

OTHER PUBLICATIONS

Johns, D., et al. "Analog Integrated Circuit Design", John Wiley & Sons, Inc., 1997, pp. 16-39 and 57-60.

English translation of Abstract of Japanese Publication No. JP 7-183344, 1 page.

* cited by examiner

PROCESS MONITOR FOR MONITORING AND COMPENSATING CIRCUIT PERFORMANCE

CROSS REFERENCE TO RELATED APPLICATIONS

This application is a continuation of U.S. patent application Ser. No. 10/963,639, entitled "Process Monitor for Monitoring and Compensating Circuit Performance," filed Oct. 14, 2004 now U.S. Pat. No. 7,357,540 which is a continuation-in-part of U.S. application Ser. No. 10/647,472, entitled "Process Monitor for Monitoring an Integrated Circuit Chip," filed Aug. 26, 2003 now U.S. Pat. No. 7,449,908 which is a continuation of U.S. application Ser. No. 10/440,311, entitled, "Process Monitor for Monitoring an Integrated Circuit Chip," filed May 19, 2003 now U.S. Pat. No. 7,309,998, which claims priority to U.S. Provisional Application No. 60/430,061, titled "Amplifier Assembly with AGC for a Tuner," filed Dec. 2, 2002, each of which are incorporated herein by reference in their entireties.

FIELD OF THE INVENTION

The present invention relates to monitoring an integrated circuit chip and compensating performance of operational circuits implemented on an integrated circuit chip.

BACKGROUND OF THE INVENTION

Variations during fabrication or manufacture of integrated circuit (IC) chips can cause unpredictable and undesired variations of circuit parameters. As a result of these parameter variations, operational circuits implemented on an IC chip may not meet their desired performance characteristics. Conventional techniques use complicated analog correction circuits, such as constant-$G_m$ bias, to adjust for deviations from optimal operation caused by process and temperature variations. Such circuits consume significant power and can typically only correct one parameter at a time. In fact, correcting more than one circuit parameter often results in the subsequent correction circuit undoing what the first correction circuit adjusted. In addition, in the case of analog correction circuitry, no readily usable output is available for the automated tester. Thus, monitoring variations among the large number of chips manufactured is difficult.

Conventional adjustment circuits are typically closed-loop feedback systems. As a result, stability (e.g., oscillation of the circuit) is often an issue. Furthermore, conventional techniques typically use circuits such as reference oscillators or filters that run in parallel with the operational circuit passing the signal. Such oscillators or filters can create spurs that couple onto the signal path, impacting the performance of the compensation circuit.

Accordingly, a need exists for a simple, flexible, open-loop compensation system that can simultaneously adjust multiple parameters associated with an operational circuit.

BRIEF SUMMARY OF THE INVENTION

The present invention to a system for monitoring and compensating performance of an operational circuit. In accordance with an aspect of the present invention, the system includes one or more integrated circuit chips and a controller. Each integrated circuit chip includes one or more operational circuits, each operational circuit having at least one controllable circuit parameter. Each integrated circuit chip also includes a process monitor module at least partially constructed thereon. The controller is coupled to each process monitor module and to each operational circuit.

In an aspect of the present invention, the controller includes a monitoring processor and a compensation processor. In a further aspect, the compensation processor includes logic and a memory. The compensation processor logic permits the compensation processor to evaluate the performance of an operational circuit based on signals requested and received from a process monitor module and determine whether any adjustments are required to one or more controllable parameters of the operational circuit. The memory stores operational circuit specific data, desired or optimal circuit performance data, and/or a table or listing of the operational circuit parameters that can be controlled.

The present invention is also directed to a method for monitoring and compensating the performance of an operational circuit. In accordance with an aspect of the present invention, the compensation processor initiates compensation processing for an operational circuit. The compensation processor then determines the data elements (e.g., integrated circuit parameters or processed parameters) that are required to perform compensation processing for the operational circuit. The controller then requests one or more sense signals from the process monitor module. Upon receipt, the one or more sense signals are used to determine values for the data elements required to perform compensation processing. The compensation processor then determines, based on the data elements and the data stored in memory, whether any deviations from desired or optimal performance are detected and whether adjustments to the operational circuit are required to compensate for the deviations.

If an adjustment is required, the compensation processor determines the circuit parameters of the operational circuit that are controllable and determines the adjustments to be made. The compensation processor then determines the value of one or more control signals to initiate the adjustment in the operational circuit. The controller then generates the control signal and communicates the signal to the operational circuit.

These and other objects, advantages and features will become readily apparent in view of the following detailed description of the invention.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 17:
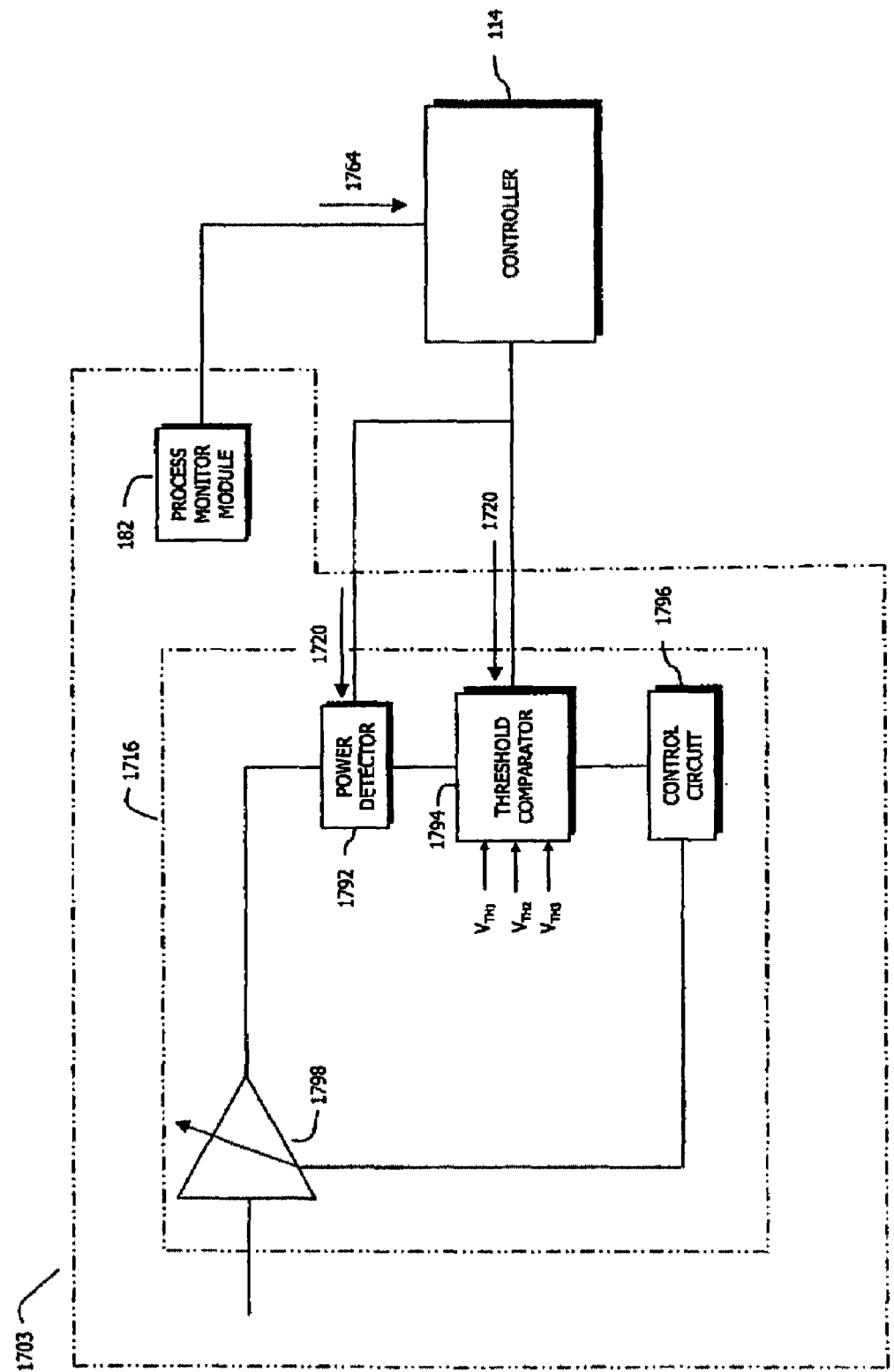

FIG. 17 is a block diagram of a system for adjusting the threshold voltage of a comparator in an operational circuit, according to embodiments of the present invention The present invention will now be described with reference to the accompanying drawings. In the drawings, like reference numbers can indicate identical or functionally similar elements. Additionally, the left-most digit(s) of a reference number may identify the drawing in which the reference number first appears.

DETAILED DESCRIPTION OF THE INVENTION

Figure 1:
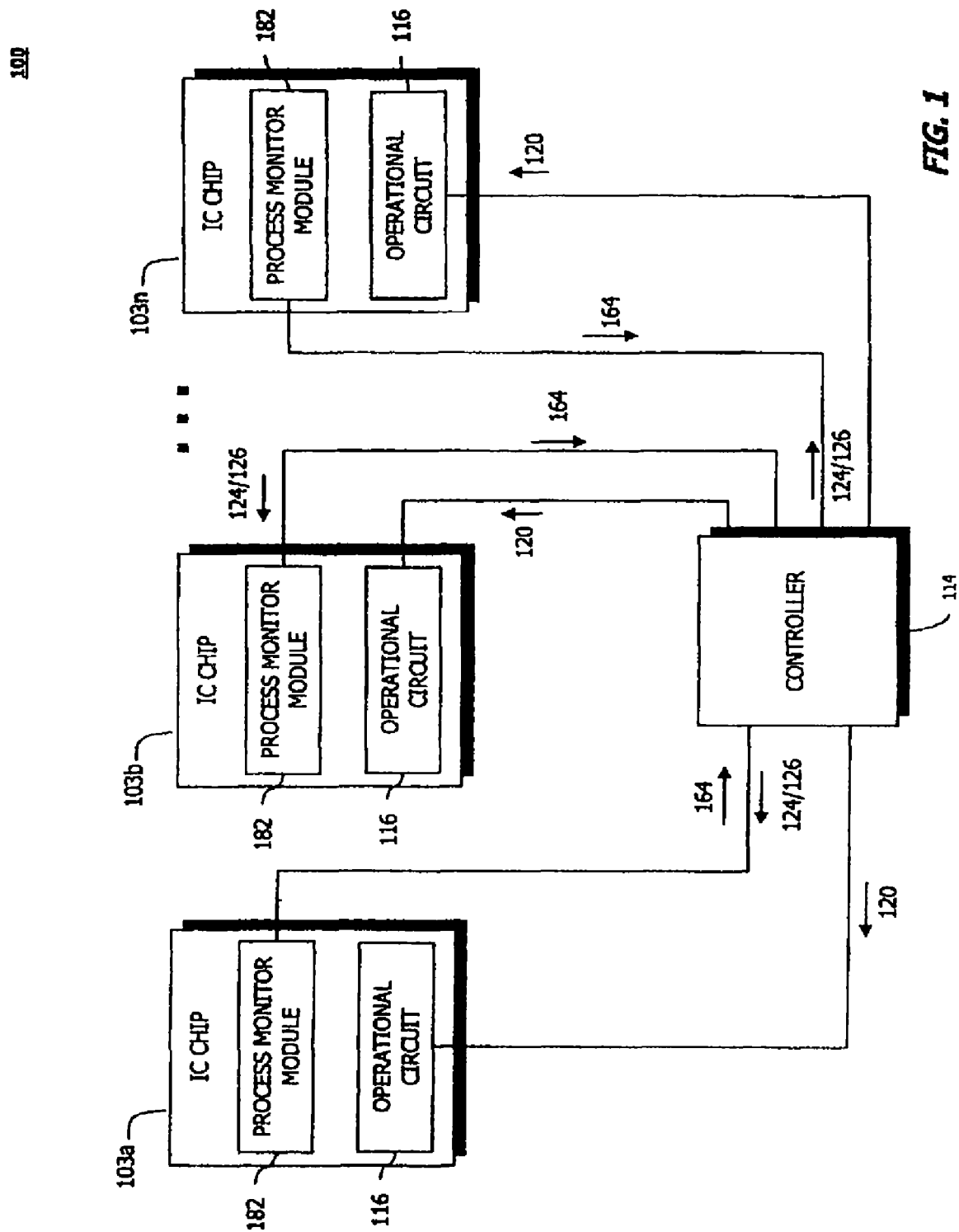
FIG. 1 is a block diagram of a system for monitoring and compensating performance of an operational circuit, according to embodiments of the present invention.

1. Architectural Embodiments of the Present Invention 1.1 Process Monitor System FIG. 1 is a block diagram of a system 100 for monitoring and compensating performance of an operational circuit, according to embodiments of the present invention. System 100 includes one or more integrated circuit (IC) chips 103a-n coupled to a controller 114. In an embodiment of the present invention, IC chip 103 is a monolithic integrated circuit implemented using a CMOS process. As would be appreciated by persons skilled in the relevant art(s), IC chip 103 may be implemented other types of technologies or processes, such as Silicon Bipolar, Gallium-Arsenide (GaAs), Indium Phosphide (InP), or Silicon Germanium (SiGe) processes.

Each IC 103 includes one or more operational circuits 116. As would be appreciated by persons skilled in the relevant art(s), an operational circuit 116 may be any circuit capable of being implemented on IC 103. In an embodiment of the present invention, operational parameters and/or the configuration of operational circuit 116 can be modified based on one or more control signal(s) received from controller 114.

A process monitor module 182 is at least partially constructed on IC chip 103. Process monitor module 182 is configured to monitor circuit parameters, operational conditions, and/or environmental conditions associated with IC 103 (collectively referred to herein as "IC data" or "IC parameters"). Process monitor module 182 produces one or more digital signals 164 indicative of the monitored conditions and/or parameters and communicates these signals to controller 114.

Controller 114 includes logic to process digital signals received from process monitor module 182. The digital signals can be received automatically from process monitor module 182. In an embodiment, controller 114 also includes logic to request digital signals from process monitor module 182. In an embodiment of the present invention, controller 114 also includes logic to identify deviations in the performance of operational circuit 116 and to generate control signals 120 to adjust operational circuit 116 to compensate for the deviations. In an embodiment of the present invention, controller 114 is included on an IC 103 containing a process monitor module 182. Controller 114 may also be located external to the IC 103. In an embodiment, one controller 114 is associated with a plurality of ICs 103. In another embodiment, each IC 103 is associated with a separate controller 114.

1.2 Process Monitor Module

Figure 2:
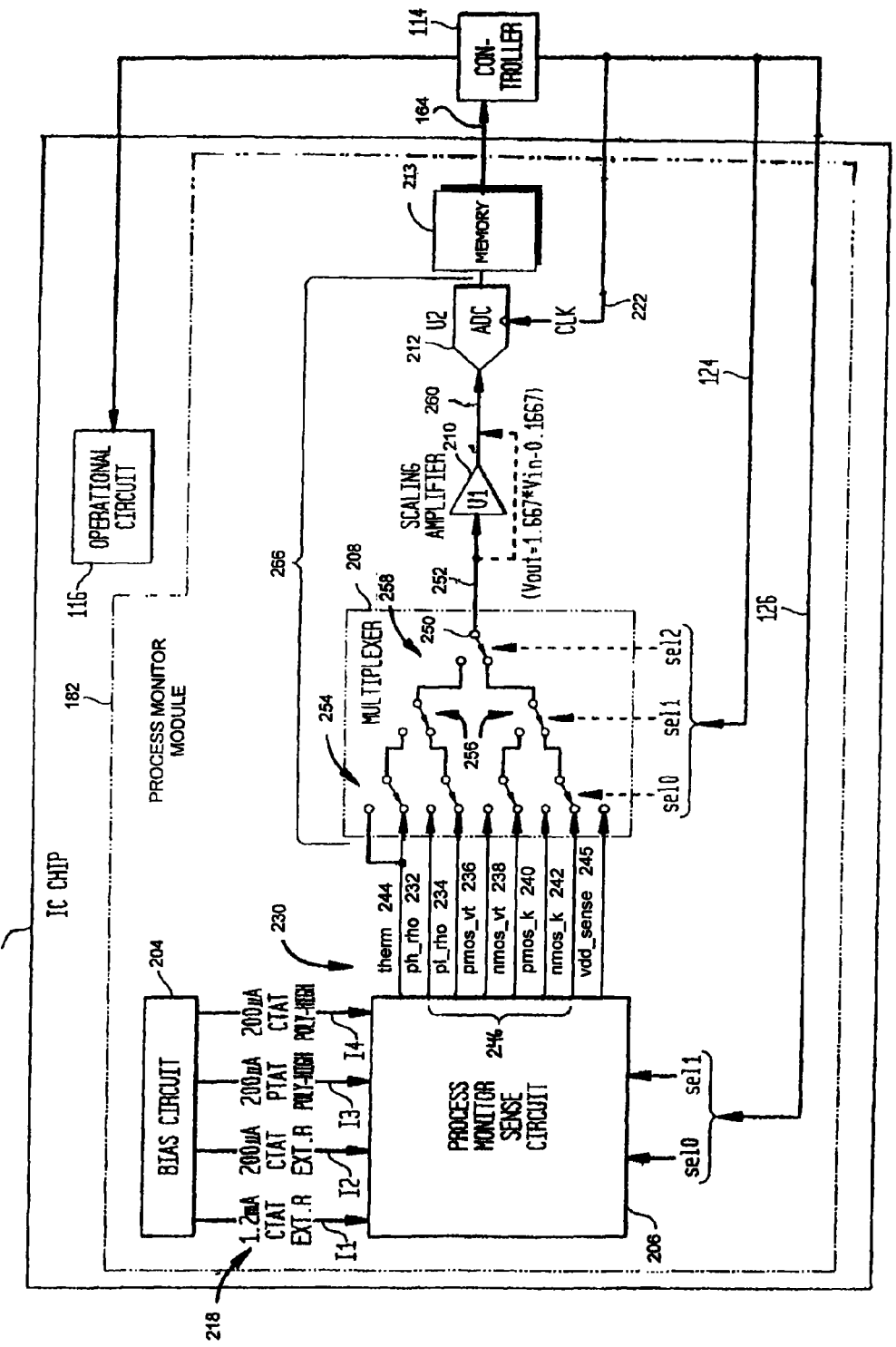
FIG. 2 is a block diagram of a process monitor module, according to embodiments of the present invention.

FIG. 2 is a block diagram of process monitor module 182, according to embodiments of the present invention. Process monitor module 182 (indicated in dashed-line) monitors process-dependent circuit parameters associated with an operational circuit 116 on IC 103, environmental conditions (such as temperature) of the IC chip 103 or substrate, and/or operational conditions (such as a power supply voltage) of the IC chip 103 (referred to collectively herein as "IC parameters" or "IC data"). Certain IC parameters are considered "process-dependent" because they depend on the particular technology used to process IC chip 103. Also, these parameters may vary from IC chip to IC chip, for any given design, because of manufacturing variations in a given process across different IC chips.

Process monitor module 182 includes a bias circuit 204, a process monitor sense circuit 206, a multiplexer 208, an optional scaling amplifier 210, and a digitizer or Analog-to-Digital converter 212.

Bias circuit 204 includes one or more current generators for generating one or more bias currents 218, including bias currents I1, I2, I3 and I4. In an embodiment of the present invention, bias circuit 204 also includes a bandgap voltage reference.

Sense circuit 206 is at least partially constructed on IC chip 103. Sense circuit 206 receives bias currents 218 from bias circuit 204 and parameter select signals 126 from controller 114. Sense circuit 206 produces one or more sense signals 230 indicative of corresponding parameters of the IC chip 103 (e.g., process-dependent circuit parameters, temperature, and/or a power supply voltage). Sense signals 230 are indicative of parameters of circuits of IC 103 that are constructed using the same process as the sense circuit, assuming relatively uniform process variations and device physical orientations across IC chip 103. In an embodiment of the invention, sense circuit 206 produces one or more of the following sense signals:

a sense signal 232 (ph_rho) indicative of a high sheet-rho of IC chip 103;

a sense signal 234 (pl_rho) indicative of a low sheet-rho of IC chip 103;

a sense signal 236 (pmos_vt) indicative of a gate-to-source threshold voltage of a PMOS transistor constructed on IC chip 103;

a sense signal 238 (nmos_vt) indicate of a gate-to-source threshold voltage of an NMOS transistor constructed on IC chip 103;

a sense signal 240 (pmos_k) indicative of a transconductance parameter (K) of a PMOS transistor constructed on IC chip 103;

a sense signal 242 (nmos_k) indicative of a transconductance parameter (K) of an NMOS transistor constructed on IC chip 103;

a sense signal 244 (therm) indicative of a temperature of IC chip 103; and a sense signal 245 (vdd_sense or VDD_SENSE) indicative of a power supply voltage (VDD) of the IC chip 103.

Sense signals 232 through 242 (indicated generally as 246) are indicative of process-dependent circuit parameters of IC 103. Sense signal 244 is indicative of temperature and sense signal 245 is indicative of power supply voltage.

In an embodiment of the present invention, sense circuit 206 produces additional sense signals. For example, sense circuit 206 may produce sense signals indicative of the capacitance of capacitor structures, of substrate leakage currents, and/or of the leakage capacitances of active devices.

Each of sense signals 232 through 245 is an analog voltage. In an embodiment of the present invention, each of the sense signals is an analog sense current. Alternatively, sense signals 232-245 may include both analog sense voltages and analog sense currents.

Sense circuit 206 provides sense signals 230 to respective inputs of multiplexer 208. Multiplexer 208 also receives control signal 124 from controller 114. At any given time, multiplexer 208 routes a selected one of sense signals 230 to an output node 250 of multiplexer 208, in accordance with switch control signal 124.

In an embodiment, multiplexer 208 includes a first column of switches 254 having switch inputs for receiving sense signals 230. Multiplexer 208 may include any number of switch inputs for receiving any number of sense signals. Switches 254 have respective switch positions controlled responsive to a control signal component sel0 common to both parameter select signals 126 and control signals 124. The outputs of switches 254 feed the inputs of a second column of switches 256 having respective switch positions controlled responsive to a second control signal component sel1 also common to both control signals 126 and control signals 124. The outputs of switches 256 feed the inputs of an output switch 258 of multiplexer 208. Output switch 258 has a switch position controlled responsive to a control signal component sel2 of control signal 124. As would be appreciated by persons skilled in the relevant art(s), other implementations of multiplexer 208 can be used in the present invention.

Optional scaling amplifier 210 receives the selected sense signal 252 from multiplexer 208 and scales selected sense signal 252 according to the dynamic range of digitizer 212 to produce a scaled sense signal 260. Digitizer 212 receives the scaled sense signal 260 from the optional scaling amplifier 210 and a clock signal 222 from controller 114. Digitizer 212 is configured to digitize the scaled sense signal 260.

Collectively, multiplexer 208, scaling amplifier 210, and digitizer 212 represent a digitizer module 266. Digitizer module 266 produces, responsive to one or more of sense signals 230, one or more of digitized signals or codes 164 representative of the one or more of sense signals 230. As would be appreciated by persons skilled in the relevant art(s), digitizer module 266 may have many alternative implementations. For example, scaling amplifier 210 may be omitted. Also, multiplexer 208 may be omitted, and replaced with multiple digitizers (such as digitizer 212) arranged in parallel with each other to digitize all of sense signals 230 in parallel.

In an embodiment of the present invention, process monitor module 182 also includes a memory 213. When present, memory 213 stores the digitized output of digitizer module 266. In an embodiment, memory 213 is a register. As would be appreciated by persons skilled in the relevant art(s), other implementations of memory 213 can be used with the present invention.

1.2.1 Bias Circuit and Sense Circuit

Figure 3:
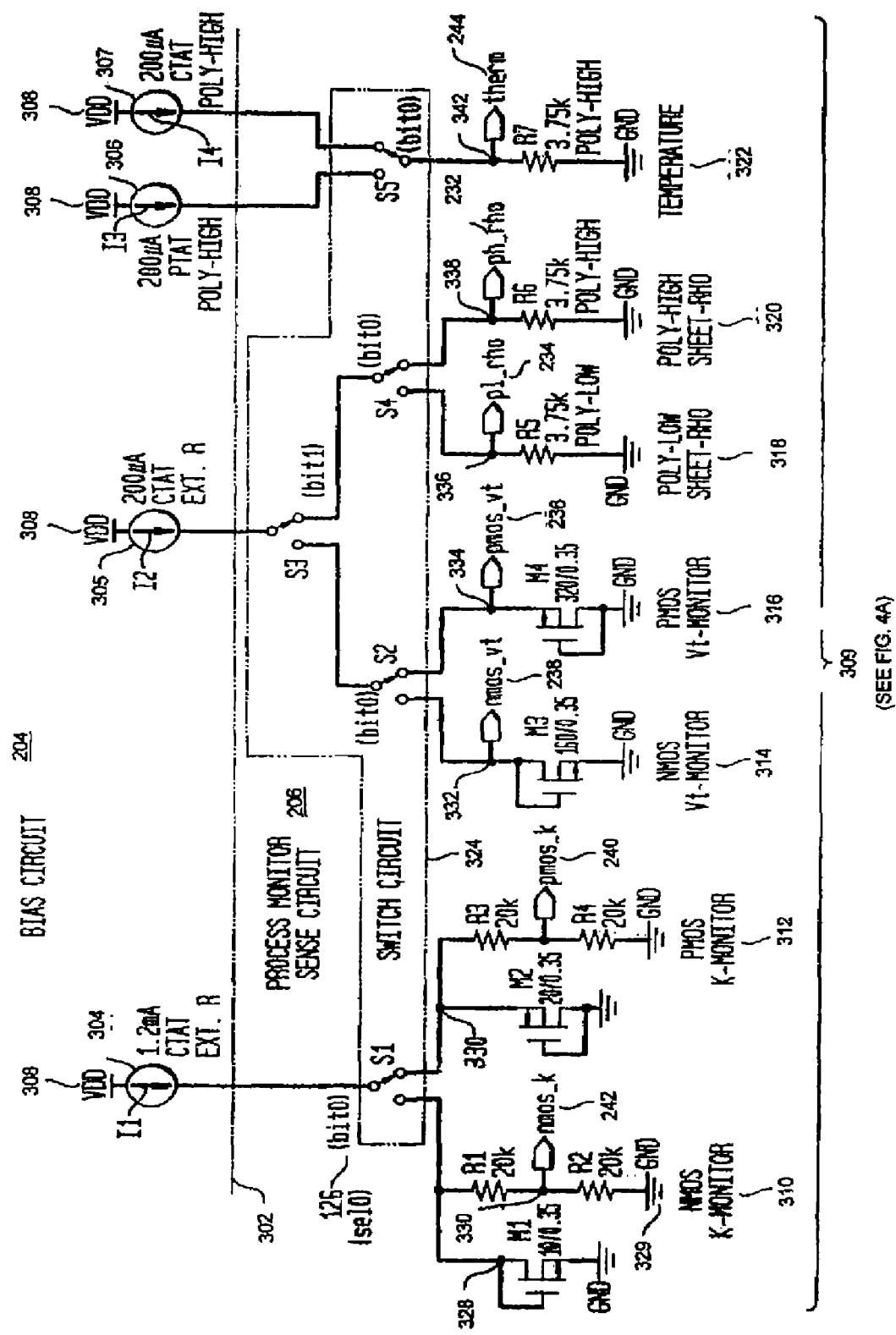
FIG. 3 is a circuit diagram of an example arrangement of a bias circuit and a process monitor sense circuit of the process monitor of FIG. 2, according to embodiments of the present invention.

FIG. 3 is a circuit diagram of an example arrangement of bias circuit 204 and process monitor sense circuit 206. Bias circuit 204 is represented above a dashed-line 302, while process monitor sense circuit 206 is represented below the dashed line 302. Example circuit parameters, including current magnitudes and types, and transistor dimensions, are indicated in FIG. 3. Bias circuit 204 is at least partially constructed on IC chip 103. Bias circuit 204 includes multiple bias current generators 304, 305, 306 and 307 for generating respective bias currents I1, I2, I3, and I4. Each of bias generators 304 through 307 receives power from a power supply rail 308 of IC chip 103 at a voltage $V_{DD}$.

Bias current I1 is a Constant-To-Absolute-Temperature (CTAT) bias current referenced to an external resistor. A CTAT bias current is a bias current that remains constant as the temperature of IC chip 103 varies. The CTAT bias current is also relatively constant as power supply voltage ($V_{DD}$) varies. The CTAT bias current is also constant with respect to IC chip process variations, because the current is referenced to an off-chip resistor, as is discussed below in connection with FIGS. 5 and 6. Another reason the CTAT bias current is constant with respect to process is that the bias current is generated based on a bandgap voltage (described below) that does not vary with process. Bias current I1 has an example, relatively high current magnitude of 1.2 milli-Amperes (mA). Similarly, bias current I2 is a CTAT bias current referenced to an external resistor and has an example, relatively low current magnitude of 200 uA. The external resistor can be independent of process, temperature and VDD variations.

Bias current I3 is a Proportional-To-Absolute-Temperature (PTAT) bias current referenced to a poly-high sheet-rho resistor, having an example current magnitude of 200 uA. Current I3 varies in proportion to the absolute temperature (in Kelvin) of IC chip 103. However, the PTAT bias currents in the present invention are essentially independent to $V_{DD}$ variations. Current I3 can vary with a poly-high sheet-rho of a resistor used in generating the current.

Bias current I4 is a CTAT bias current referenced to poly-high sheet-rho resistor, having an example current magnitude of approximately 200 uA.

Sense circuit 206 includes one or more individual sense element circuits 309 constructed on IC chip 103. Each of these sense element circuits is also referred to herein equivalently and interchangeably as a sense element, a monitor, or a sensor. Multiple sense elements 309 include an NMOS k-Monitor 310, a PMOS k-Monitor 312, an NMOS Vt-Monitor 314, a PMOS Vt-Monitor 316, a poly-low sheet-rho sense element 318, a poly-high sheet-rho sense element 320, a temperature sensor 322, and a power supply voltage ($V_{DD}$) sensor 350 (depicted in FIG. 4A). In an alternate embodiment, additional sense elements are included in sense elements 309. For example, sense elements 309 may include a capacitance sense element, a substrate leakage current element, and/or a leakage capacitance sense element.

Sense circuit 206 also includes a switch circuit 324, including multiple bias current switches S1, S2, S3, S4 and S5, coupled between bias circuit 204 and sense elements 309. Switches S1-S5 may be transmission-gate switches. Switches S1-S5 selectively direct bias currents I1, I2, I3 and I4 to selected ones, or a subset, of sense elements 309, responsive to switch control component signals sel0 (also referred to as bit0) and sel1 (also referred to as bit1). More specifically, switch S1 directs bias current I1 to either sense element 310 or sense element 312 in accordance with component signal sel0. Collectively, switches S3, and S2 and S4, direct bias current I2 to one of sense elements 314, 316, 318 and 320, in accordance with component switch control signals sel0 and sel1. Also, switch S5 directs either bias current I3 or bias current I4 to sense element 322 in accordance with component signal sel0.

Figure 4A:
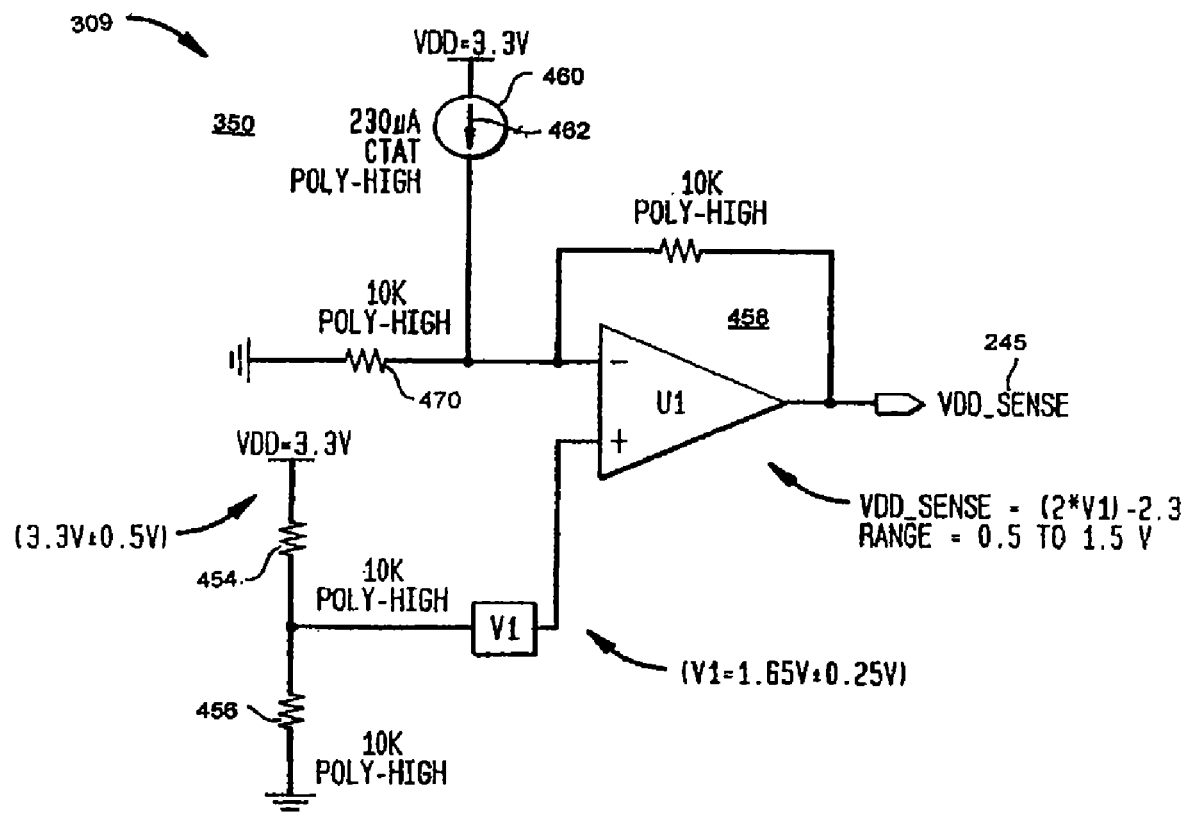
FIG. 4A is a circuit diagram of an example power supply sense element used in the process monitor sensor circuit of FIG. 2, according to embodiments of the present invention.

Although sensor 350 is depicted in FIG. 4A as having a dedicated current source (460), in an alternative arrangement, any of current sources 305 and 307 may be switched to supply a CTAT bias current to sense element 350.

1.2.1.1 Transconductance Parameter (K) Monitors

Sense element 310 includes a relatively small NMOS transistor M1 connected or configured as a diode. That is, transistor M1 includes a gate and a drain connected together at a node 328, and a source connected to a ground 329 of IC chip 103.

Sense element 310 optionally includes a potential voltage divider including a resistor R1 and a resistor R2 connected in series with one another and between node 328 and ground 329. Sense signal 342 is tapped-off from a node 330 between resistors R1 and R2. The voltage divider establishes sense signal 242 at a voltage commensurate with a dynamic range of digitizer 212. The use of large resistance value resistors in the voltage divider limits current through the resistors, which reduces error in the sense voltage. In an embodiment of the present invention, sense signal 242 is taken directly from node 328. In an embodiment, a buffer amplifier having an exemplary gain of 0.5 can be used instead of a resistor voltage divider.

When switch S1 is positioned so as to direct or supply bias current I1 to sense element 310, transistor M1 develops a gate-to-source voltage at node 328. Transistor M1 is sized in relation to the magnitude (ID) of current I1 so that transistor M1 operates at a relatively high current density (HCD) JHCD. Thus, transistor M1 is referred to as a high current density device. Due to the high current density in transistor M1, the gate-to-source voltage established at node 328 is substantially greater than the gate-to-source threshold voltage of the transistor. For example, in a 0.35 micron CMOS process, the gate-to-source voltage at node 228 may be in the approximate voltage range of 1.5 to 2.0 volts, whereas the threshold voltage may be only approximately 500 millivolts. The difference between the voltage at node 328 and the gate-to-source threshold voltage of transistor M1 is indicative of the transconductance parameter (K) of the transistor. In this way, the voltage at node 328 is indicative of the transconductance parameter. Stated otherwise, transistor M1 is biased at a large value of gate-to-source voltage (VGS) minus threshold voltage (VTH), which provides useful information on the transconductance parameter K. Because the voltage at node 328 is proportional to the voltage of sense signal 242 (nmos_k), sense signal 242 is similarly indicative of the transconductance parameter.

Sense element 312 is similar in construction and operation to sense element 310 except that sense element 312 includes a relatively small PMOS transistor M2 connected as a diode, instead of the NMOS transistor used in circuit 310. Sense element 312 also includes an optional potential divider, including resistors R3 and R4 connected in series with each other and between node 330 and ground. Similar to above, the voltage divider establishes sense signal 240 at a tap-point between the resistors, such that the voltage is commensurate with a dynamic range of digitizer 212.

When switch S1 directs relatively large bias current I1 to sense element 312 as depicted in FIG. 3, transistor M2 develops a gate-to-source voltage at a node 330 (which is connected to the source of transistor M2). Transistor M2 is sized in relation to the magnitude of current I1 so that transistor M2 operates at a relatively high current density JHCD. Thus, the voltage at node 330 is substantially greater than the gate-to-source threshold voltage of transistor M2. The voltage at node 330, and correspondingly, the voltage of sense signal 240 (pmos_k), is indicative of the transconductance parameter of transistor M2.

1.2.1.2 Threshold Voltage $V_{TH}$ Monitors

Sense element 314 includes a relatively large NMOS transistor M3 connected as a diode between ground and an output node 332 (which is connected to the gate and drain of transistor M3). When switches S3 and S2 are configured to direct or supply relatively small bias current I2 to sense element 214, transistor M3 develops a gate-to-source voltage at node 332 (i.e., sense signal 238 (nmos_vt)) responsive to current I2. Transistor M3 is sized in relation to the magnitude of current I2 such that transistor M3 operates at a low current density (LCD) JLCD, e.g., in relation to the high current density at which transistors M1 and M2 operate. This low current density causes the gate-to-source voltage developed at node 332 to be at or near the gate-to-source threshold voltage of transistor M3. For example, in a 0.35 micron CMOS process, the threshold voltage may be approximately 500 millivolts. Thus, sense signal 238 is representative of the gate-to-source threshold voltage of transistor M3.

Sense element 316 includes a relatively large PMOS transistor M4 connected as a diode between ground and an output node 334 (which is connected to source of transistor M4). When switches S3 and S2 are configured to direct or supply relatively small bias current I2 to sense element 316, transistor M4 develops a gate-to-source voltage at node 334 representing sense signal 236 (pmos_vt). Transistor M4 is sized in relation to the magnitude of current I2 such that transistor M4 operates at a low current density, e.g., in relation to the high current density at which transistors M1 and M2 operate. This low current density causes transistor M4 to develop a voltage at node 332 that is at or near the gate-to-source threshold voltage of the transistor. Thus, sense signal 236 is representative of the gate-to-source threshold voltage of transistor M4.

1.2.1.3 Sheet-Rho Monitors

If a known, constant bias current is applied to a known resistance value of an on-chip resistor, the voltage developed across the resistor will be proportional to its resistance value. A voltage higher than nominal would indicate high sheet resistance (sheet-rho) for this type of resistor, and vice-versa. Sense element 318 and 320 take advantage of this effect.

Sense element 318 includes a resistor R5 connected between an output node 336 and ground 329. Resistor R5 is made of a resistance material, such as silicided polysilicon, having a relatively low sheet-rho. When switches S3 and S2 are configured to supply bias current I2 to resistor R5, the resistor develops a voltage at node 336 corresponding to sense signal 234 (pl_rho).

Sense element 320 includes a resistor R6 coupled between ground 329 and output node 338. Resistor R6 is made of a resistance material, such as unsilicided polysilicon, and has a relatively high sheet-rho, compared to the sheet resistance of resistor R5. When switches S3 and S4 direct bias current I2 to resistor R6, the resistor develops a voltage at output node 338 corresponding to sense signal 232 (ph_rho).

1.2.1.4 Temperature Sensor

Sense element 322 includes a resistor R7 connected between an output node 342 and ground 329. When switch S5 is configured to direct CTAT bias current I4 to resistor R7, resistor R7 develops a first voltage at node 342. On the other hand, when switch S5 is configured to direct PTAT bias current I3 to resistor R7, the resistor develops a second voltage at node 342. A difference between the first voltage and the second voltage developed at node 342 indicative of a temperature of IC chip 103.

1.2.1.5 Power Supply Voltage ($V_{DD}$) Sensor

FIG. 4A is a circuit diagram of sense circuit 350 for monitoring power supply voltage $V_{DD}$ of IC chip 103. Sense circuit 350 is coupled to a power supply rail of IC chip 103. A voltage divider, including resistors 454 and 456, presents a voltage V1 equal to one-half $V_{DD}$ to a positive input of operational amplifier 458. For example, if $V_{DD}$=3.3 Volts (V) and can vary +/−0.5V, then the positive input to opamp 458 will be 1.65V+/−0.25V. Note that is not important what type of resistors is used, so long as both resistors 454 and 456 match each other.

Figure 5:
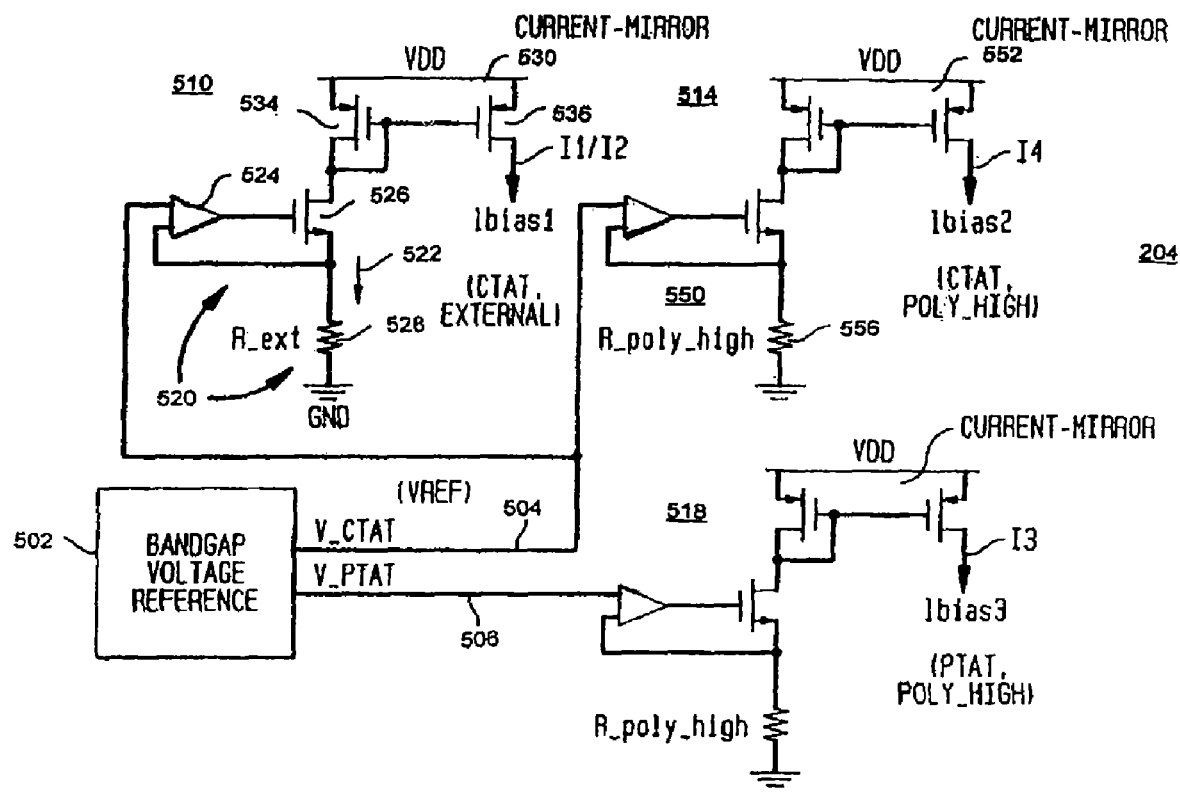
FIG. 5 is a circuit diagram expanding on the bias circuit of FIG. 3, according to embodiments of the present invention.

A current source 460 supplies a CTAT current 462 referenced to an internal (i.e., on-chip) poly-high resistor (see FIG. 5 for details). When current 462 drives a resistor 470, a Thevenin equivalent circuit is formed that is the same as a 2.3V fixed Direct Current (DC) voltage source in series with a 10 kilo-ohm poly-high resistor. Since poly-high resistors are used in both the bandgap-based current reference (FIG. 5) and $V_{DD}$ sense element 350, variations in resistor sheet-rho are cancelled out. Resistor 470 sets the proper gain for $V_{DD}$ sense circuit 350. The end result is a circuit with the following transfer function:

$$V_{DD}\_SENSE=(2*V1)-2.3$$

where $V_{DD}$_SENSE (signal 245) is indicative of power supply voltage $V_{DD}$.

The transfer function above creates $V_{DD}$_SENSE such that it ranges from 0.5V to 1.5V as $V_{DD}$ changes from 3.3−0.5V to 3.3+0.5V, substantially perfectly matching the input range of digitizer 212. Thus, $V_{DD}$ sense circuit 350 presents an input to digitizer 212 with full resolution as $V_{DD}$ changes over a +/−0.5V range, from its nominal value of 3.3V. Other $V_{DD}$ sense circuits can be designed based on similar approaches.

1.2.1.6 Nominal Voltage Monitor

Figure 4B:
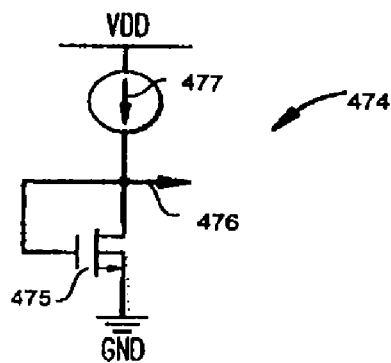
FIG. 4B is a circuit diagram of an example "nominal voltage" monitor used in the process monitor sense circuit of FIG. 2, according to embodiments of the present invention.

In an embodiment, process monitor sense circuit 206 includes another type of monitor or sense circuit referred to herein as a "nominal voltage" monitor, depicted in FIG. 4B. FIG. 4B is a circuit diagram of an example "nominal voltage" monitor 474. Monitor 474 has a circuit structure that is similar to or the same as that of the K monitor (e.g., monitor 310 or 312) or the VTH monitor (e.g., monitor 314 or 316). For example, "nominal voltage" monitor 474 includes a transistor 475 configured to produce a sense signal (i.e., its gate-source voltage) 476 responsive to a bias current 477 supplied to the transistor. As will be described below, sense signal 476 is representative of a nominal gate-to-source voltage, which is a process-dependant circuit parameter. "Nominal voltage" monitor 474 provides sense signal 476 (i.e., its gate-to-source voltage) to multiplexer 208, for example, in signal set 230.

Transistor 475 is configured similar to or in the same way as any of transistors M1, M2 M3, or M4 in FIG. 3 are configured in their respective monitor circuits. However, in contrast to the K and $V_{TH}$ monitors, transistor 475 is sized in relation to bias current 477 so as to operate at (i) a nominal current density that is between the relatively high and low current densities of the K and $V_{TH}$ monitors, and (ii) a corresponding nominal gate-to-source voltage that is between the relatively high and low gate-to-source voltages associated with the K and $V_{TH}$ monitors. The nominal current density and corresponding nominal gate-to-source voltage are representative of a nominal (i.e., typical) current density and a corresponding nominal gate-to-source voltage, respectively, associated with transistors in operational circuit 116. For a 0.35 micron CMOS process, an example nominal gate-to-source voltage is approximately 1.2 volts.

The example process-dependent circuit parameters described above, including (i) the nominal gate-to-source voltage, (ii) the transconductance parameter (K), and (iii) the gate-to-source threshold voltage $V_{TH}$, are together generally referred to as "transistor-dependent" process-dependent circuit parameters because they relate to (i.e., are associated with) and/or characterize transistors constructed on the IC chip. The present invention is not limited to these transistor-dependent circuit parameters.

1.2.2 Bias Circuit

FIG. 5 is a circuit diagram of an example embodiment of bias circuit 204. Bias circuit 204 includes a bandgap voltage reference circuit 502 that generates a CTAT voltage 504 (V_CTAT), and a PTAT voltage 506 (V_PTAT). Circuit 502 provides CTAT voltage 504 to a first current generator 510 for generating CTAT bias current I1 (or for generating CTAT bias current I2) and a current generator 514 for generating CTAT bias current I4. Bandgap circuit 502 provides PTAT voltage 506 to a current generator 518 for generating PTAT bias current I3.

Current generator 510 includes a circuit 520 for converting CTAT voltage 504 to a corresponding CTAT current 522. Circuit 520 includes an operational amplifier 524 that receives CTAT voltage 504, and in response, drives the gate of a transistor 526. Transistor 526 has a source-drain current path connected in series with an off-chip resistor 528 (R_ext). Resistor 528 is selected to have a very low temperature coefficient. Resistance 528 is also selected to have a tight tolerance of between 1% and 5% in its absolute resistance value, typically. Current generator 510 also includes a current mirror 530 coupled between circuit 520 and a power supply rail at the voltage $V_{DD}$. Current mirror 530 includes a diode connected transistor 534 connected between the source-drain path of transistor 526 and the power supply rail. Current mirror 530 also includes a mirror transistor 536 coupled to transistor 534. Current mirror 530 mirrors current 522 in output transistor 536, as either bias current I1 (or bias current I2). Transistors 534 and 536 may be sized in relation to each other to scale the magnitude of current I1 (or I2) in relation to the magnitude of current 522.

Current generator 514 includes a circuit 550 (similar to circuit 520), coupled with a current mirror 552 (similar to current mirror 530). Circuit 550 include a resistor 556 made of a resistance material having a relatively high sheet-rho. Preferably, resistor 556 is constructed on-chip so as to match other on-chip resistors.

Current generator 518 is configured in the same manner as current generator 514. However, current generator 518 generates bias current I3 from PTAT voltage 506. Thus, bias current I3 is a PTAT bias current instead of a CTAT bias current. Alternative circuits may be used for generating the PTAT and CTAT currents used in the present invention, as would be apparent to one having ordinary skill in the relevant art(s) given the present description.

Figure 6:
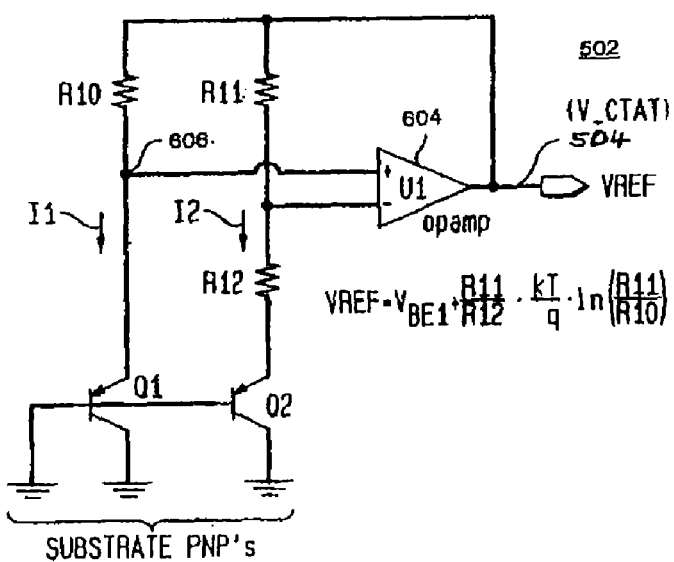
FIG. 6 is a circuit diagram of an arrangement of a bandgap voltage reference circuit, according to embodiments of the present invention.

FIG. 6 is a circuit diagram of an embodiment of a bandgap voltage reference circuit 502. Circuit 502 includes a pair of diode-connected bipolar transistors Q1 and Q2 connected with a network of resistors R10, R11 and R12. Tap points off of the resistor network feed an operational amplifier 604 that generates CTAT voltage 504 (also referred to as $V_{REF}$ in FIG. 6). Circuit 502 produces PTAT voltage 506, or a voltage from which the PTAT voltage may be derived, at a node 606 of the resistor network, possibly with the aid of a scaling amplifier.

1.3 Controller

Figure 7:
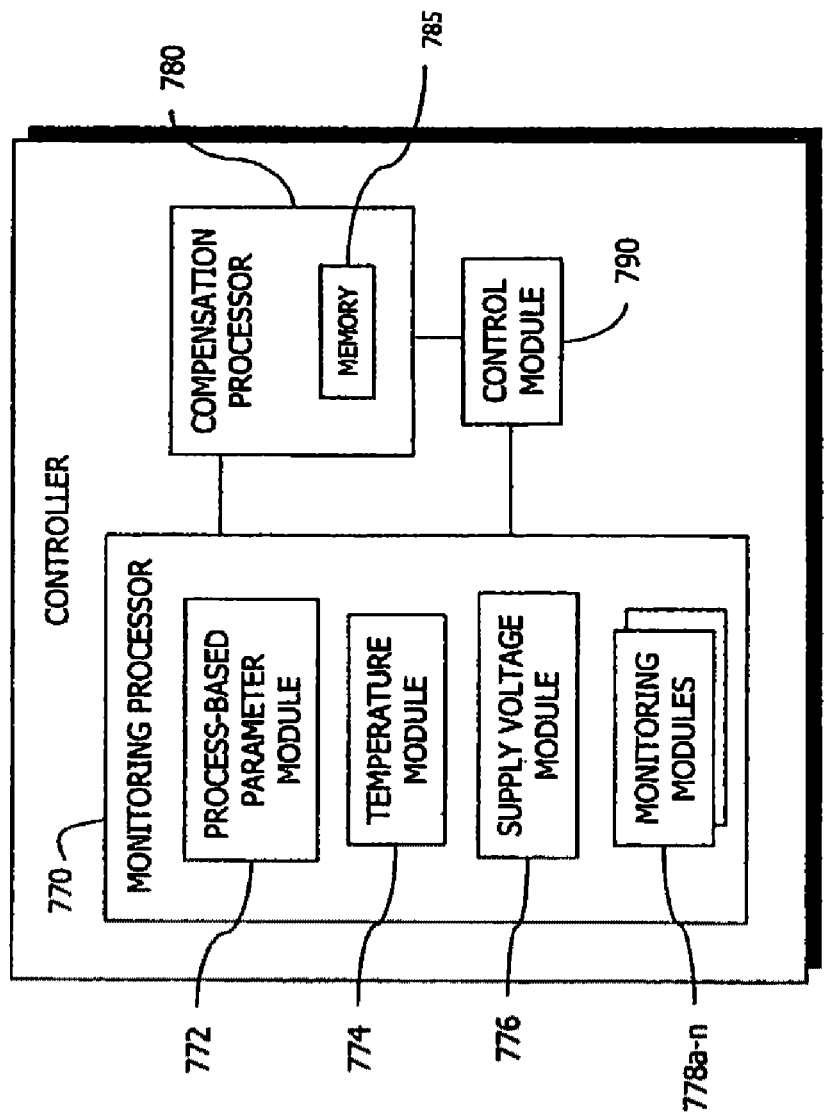
FIG. 7 is a block diagram of a controller, according to embodiments of the present invention.

FIG. 7 depicts a block diagram of controller 114, according to embodiments of the present invention. Controller 114 includes a monitoring processor 770 coupled to a compensation processor 780. Controller 114 may also include a control module 790 coupled to monitoring processor 770 and/or compensation processor 780.

Monitoring processor 770 requests and receives one or more signals from process monitor module 182 (FIG. 1). Monitoring processor 770 includes one or more modules for processing the received signals. In an embodiment of the present invention, monitoring processor 770 includes a process-based parameter module 772, a temperature module 774, and a supply voltage module 776. Monitoring processor 770 may also include one or more monitoring modules 778a-778n to provide additional logic for processing the signals received from process monitor module 182.

In the arrangement depicted in FIG. 2, at any given time, controller 114 receives a digitized signal 164 corresponding to one of sense signals 230. Over time, controller 114 asserts control signals 124 and 126 such that different or successive ones of sense signals 230 are digitized and presented to monitoring processor 770. Thus, digitizer 212 presents to controller 114 digitized signals or codes representative of each of analog signal 230 over time. Based on each of these digitized representations of sense signals 230, controller 114 determines the corresponding process-based circuit parameters, temperature and/or power supply voltage of IC 103.

For example, monitoring processor 770 may determine the value of sheet-rho for a low sheet-rho or a high sheet-rho resistor constructed on IC 103, a value of a gate-to-source threshold voltage for a PMOS or an NMOS transistor constructed on the IC 103, a value of a transconductance parameter (K) of a PMOS or an NMOS transistor constructed on IC 103, a temperature of the IC 103, and/or a power supply voltage. Based on one or more of these process-based circuit parameters, the temperature and/or the power supply voltage of IC chip 103, monitoring processor 770 may then determine one or more further circuit parameters associated with operational circuit 116.

Process-based module 772 includes logic to determine the values of one or more process-dependent circuit parameters (e.g., transconductance parameter, gate-to-source voltage, resistivity).

Process module 772 requests one or more digital sense signals indicative of the process-dependent circuit parameters to be determined. Upon receipt of the requested digital sense signals, the process module 772 processes the signals to determine the desired process-dependent circuit parameters.

In an embodiment, process-based module 772 includes one or more sub-modules 772a-772n. When present, each sub-module includes logic to determine the value of one or more specific process-dependent parameters.

Temperature module 774 includes logic to determine a temperature value based on a digitized sense signal indicative of temperature.

Supply voltage module 776 includes logic to determine a power supply voltage value based on a digitized sense signal indicative of the voltage.

Compensation processor 780 is configured to evaluate performance of one or more operational circuits and to generate control signals to compensate for deviations from optimal performance. Because a wide variety of different operational circuits 116 (not shown) can be supported by the present invention, compensation processor 780 includes logic to compensate for one or more variables associated with types and/or configurations of supported operational circuits. As would be appreciated by persons skilled in the relevant art(s), this logic may be included in a plurality of modules or may be included in a single module. Compensation processor determines the variable, circuit type, and/or circuit configuration being evaluated.

Compensation processor 780 includes logic to request the necessary IC data and/or processed circuit parameters required to perform compensation processing for the identified variable, circuit type, and/or circuit configuration. Compensation processor 780 further includes logic to process the received digital signals and/or IC parameters to evaluate performance of an operational circuit 116 (not shown). If compensation processor 780 determines that adjustments are necessary to compensate for deviations from optimal circuit performance, compensation processor 780 communicates one or more control signals 120 (not shown) to the operational circuit to initiate the required modifications.

Compensation processor 780 may also include a memory 785. Memory 785 stores data associated with one or more operational circuits 116 capable of being monitored and evaluated by monitoring processor and/or compensation processor 780. For example, memory 785 may store the geometries of circuit elements such as transistors, resistors, and/or capacitors. Memory 785 may also store desired or optimal values for specific circuit parameters or variables. For example, for an operational amplifier circuit, memory 785 may store the optimal voltage gain of the amplifier. In an embodiment, for each supported operational circuit, memory 785 may also store a table or listing of operational circuit parameters that are controllable.

Optional communications control module 790 communicates parameter select signals 126 and control signals 124 (not shown) to the process monitor module, communicates control signals 120 (not shown) to operational circuit 116, and receives digital sense signals 164 (not shown) from the process monitor module and communicates the received digital sense signals to the appropriate processor. In addition, communications control module 790 generally also provides a clock signal 222 to digitizer 212 (FIG. 2). In an embodiment of the present invention, this logic is included in monitoring processor 770 and/or compensation process 790.

Controller 114 includes digital circuits, analog circuits, firmware, and/or software, or any combination thereof, as would be apparent to one having ordinary skill in the relevant art(s). For example, controller 114 may be a computer system including a digital controller coupled with (i) a memory for storing data and software programs, and (ii) input/output interfaces coupled to digitizer module 266 and sense circuit 206. The software programs include one or more software modules for implementing the methods of the present invention.

2. Process Monitor System Methods

2.1 Monitoring Methods

Figure 8:
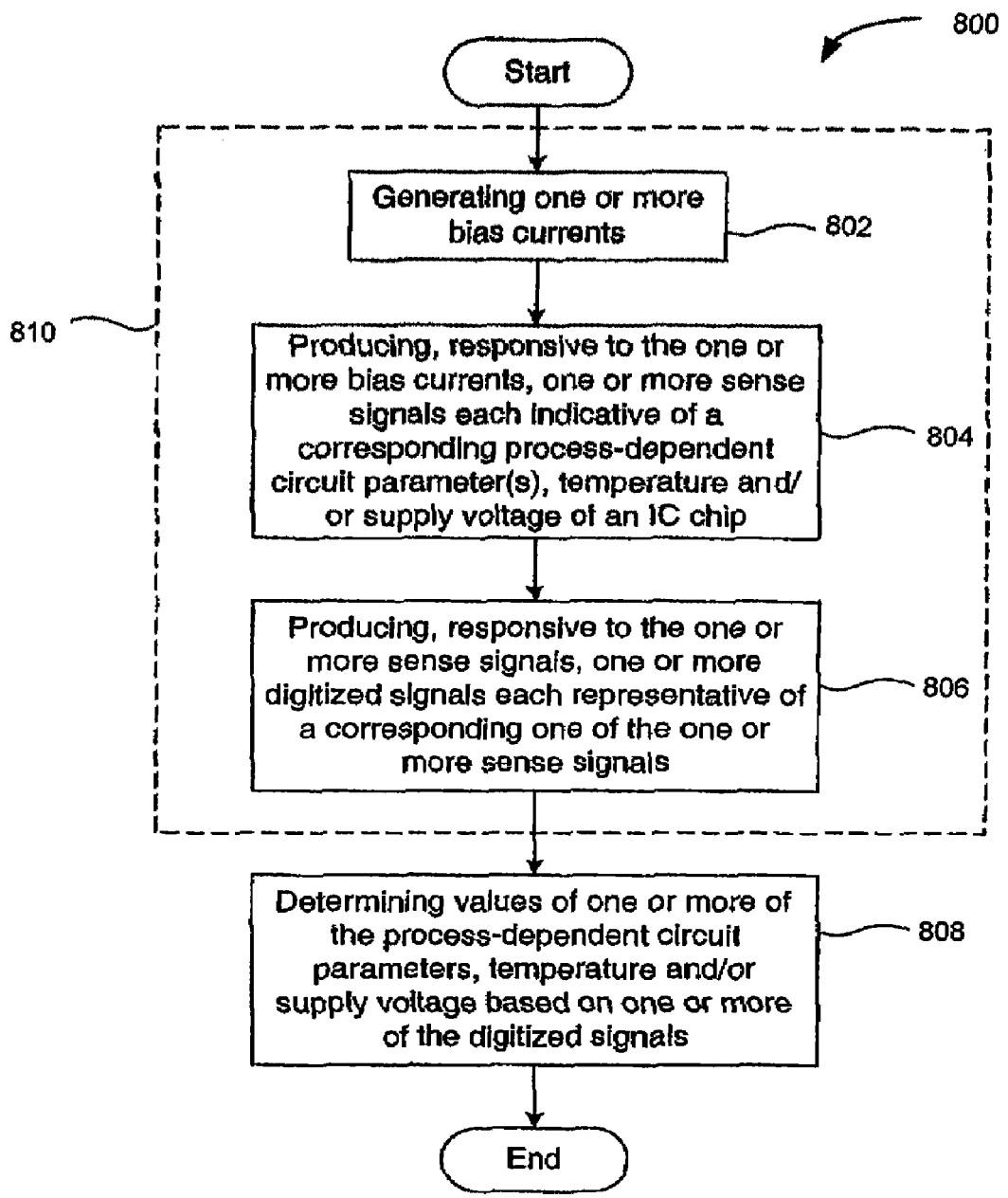
FIG. 8 is a flowchart of an example method that may be performed by the process monitor module and controller of FIG. 1, according to embodiments of the present invention.

FIG. 8 is a flowchart of an example method 800 that may be performed by system 100. A first step 802 includes generating one or more bias currents. For example, bias circuit 204 generates one or more bias currents 218.

A next step 804 includes producing, responsive to the one or more bias currents, one or more sense signals each indicative of a corresponding process-dependent circuit parameter of IC 103. For example, sense circuit 206 produces, responsive to the one or more bias currents 218, one or more sense signals 230 each indicative of a corresponding process-dependant circuit parameter of IC 103, a temperature of the IC 103, and a power supply voltage of the IC 103. Any subset of these sense signals may be produced in this step.

A next step 806 includes producing, responsive to the one or more sense signals, one or more digitized signals each representative of a corresponding one of the one or more sense signals. For example, digitizer module 266 produces digitized signal(s) 164 corresponding to sense signals 230.

Steps 802, 804 and 806 collectively represent a step of producing one or more digitized sense signals each representative of corresponding ones of one or more process-dependent circuit parameters, a temperature, and/or a power supply voltage of IC 103 (step 810). Step 802 is optional, and may be omitted in an alternative arrangement of method 800. Process monitor module 182 may perform step 810.

A next step 808 includes determining values of one or more of the process-dependant circuit parameters, the IC chip temperature, and the power supply voltage of the IC chip, based on one or more of the digitized signals (collectively referred to herein as "processed IC data" or "processed parameters"). For example, monitoring processor 770 determines values of the process-dependant circuit parameters, the temperature, and the power supply voltage based on digitized signal(s) 164.

Figure 9:
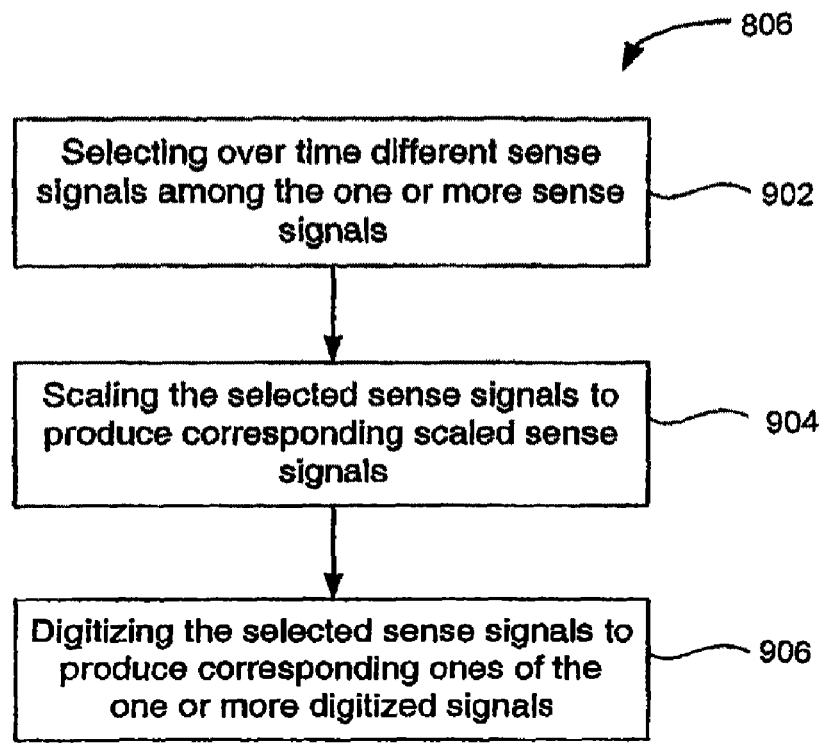
FIG. 9 is a flowchart of further method steps expanding on the method of FIG. 8, according to embodiments of the present invention.

FIG. 9 is a flowchart of further method steps performed in step 806 of method 800. Step 806 includes a further step 902. Step 902 includes selecting over time different sense signals among the one or more sense signals from step 804. For example, multiplexer 208 selects one of sense signals 230 responsive to control signals 124.

An optional next step 904 includes scaling the selected sense signals to produce corresponding scaled sense signals. For example, scaling amplifier 210 can perform this step.

A next step 906 includes digitizing the scaled, selected sense signals to produce corresponding ones of the one or more digitized signals. For example, digitizer 212 can perform this step.

Figure 10:
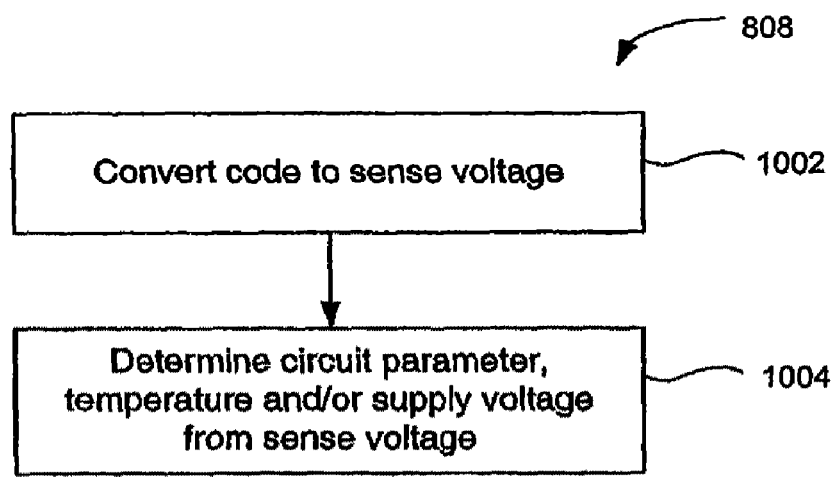
FIG. 10 is a flowchart of further method steps expanding on the method of FIG. 8, according to embodiments of the present invention.

FIG. 10 is a flowchart expanding on step 808 of method 800. A first step 1002 includes converting a digitized code into a corresponding sense voltage of one of the sense signals. For example, monitoring processor 770 converts digitized code 164 to a corresponding sense voltage $V_{sense}$.

A next step 1004 includes determining a value an IC parameter corresponding to the digitized code, based on the sense voltage $V_{sense}$. For example, processing monitor 770 determines the value of an IC parameter from the determined voltage $V_{sense}$.

Steps 1002 and 1004 may also be repeated to determine IC parameters, such as transconductance parameter K, that depends on other IC parameters, such as gate-source threshold voltage $V_{TH}$.

2.1.1 Determining Temperature

Monitoring processor 770 may determine the temperature of IC 103 based on sense signal 244, as represented in digitized code 164. The temperature may be determined as follows. First, apriori temperature-sense voltage data is established. For example, simulations and/or actual test data may be used to find sense voltages of sense signal 244 (therm) at different IC chip temperatures. Based on this established apriori data, during the operation of monitoring processor 770, digitized code 164 can be used to determine IC chip temperature.

For example, consider the following apriori data:

When T=0C, $V_{sense}$=0.6370 volts

When T=100C, $V_{sense}$=0.8843 volts where $V_{sense}$ represents the voltage of sense signal 244.

Fitting these data points to a straight line:

$$V_{sense} = (2.473 \cdot 10^{-3}) \cdot T + 0.6370$$

$$T = (3.851) \cdot code - 95.84$$

For example, let code=33, then:

$$T = (3.851) \cdot (33) - 95.84 = 31.2$$

In another embodiment, temperature T may be determined based on determined values of sheet-rho and a bias current resistor size, and a temperature coefficient of the resistor.

2.1.2 Determining Transistor Threshold Voltage $V_{TH}$

Process monitor module 182 and monitoring processor 770 can be used to determine a gate-to-source threshold voltage of a transistor constructed on IC chip 103. Specifically, monitoring processor 770 can determine the gate-to-source threshold voltage of either of transistors M3 and M4 in respective sense elements 314 and 316. The determined gate-to-source threshold voltage is representative of the gate-to-source threshold voltages of other transistors constructed on IC chip 103, for example, in operational circuit 116, because all such circuits were created using the same process.

The current $I_D$ flowing in low current density (LCD) transistor M3 or M4, for example, is given by the following expression:

$$I_D = \frac{K}{2} \cdot \frac{W}{L} \cdot (V_{GS\_LCD} - V_{TH})^2 \cdot [1 - \lambda(V_{DS} - V_{\mathit{eff}})]$$

where:

$I_D$: Direct Current (DC) drain current of the low current density (LCD) transistor M3 or M4;

K: transconductance parameter of the transistor,

W: width of the transistor;

L: channel length of the transistor;

$V_{GS\_LCD}$: gate-source voltage of the transistor.

Here, $V_{GS\_LCD}$ corresponds to sense signal 138 (nmos_vt) or 136 (pmos_vt);

$V_{TH}$: threshold voltage of the transistor;

λ: channel length modulation parameter;

$V_{DS}$: drain-source voltage of the transistor; and $V_{\mathit{eff}}$: voltage at which the transistor is in-between saturation and triode operation.

Neglecting channel length modulation effects for mathematical convenience:

$$I_D = \frac{K}{2} \cdot \frac{W}{L} \cdot (V_{GS\_LCD} - V_{TH})^2$$

Solving for $V_{TH}$:

$$V_{TH} = V_{GS\_LCD} - \sqrt{\left(\frac{2I_D}{K}\right) \cdot \left(\frac{L}{W}\right)}$$

$$\approx V_{GS\_LCD} \text{(for very low drain currents)}$$

Thus, if $I_D$ is very low for the particular size device, then $V_{TH} = V_{GS}$ (where $V_{GS}$ is $V_{GS\_LCD}$). It is to be understood that channel length modulation effects need not be neglected in the analysis above and below.

2.1.3 Determining Transistor Transconductance Parameter K

Process monitor module 182 and monitoring processor 770 can be used to determine a transconductance parameter K of a transistor constructed on IC chip 103. Specifically, process monitor module 182 and monitoring processor 770 can determine the transconductance parameter K of either of transistors M1 and M2 in respective sense elements 310 and 312. The determined transconductance parameter is representative of the transconductance parameter of other transistors constructed on IC chip 103, such as transistors M3 or M4, or transistors in operational circuit 116.

The current $I_D$ flowing through high current density transistor M1 or M2, for example, is given by:

$$I_D = \frac{K}{2} \cdot \frac{W}{L} \cdot (V_{GS\_HCD} - V_{TH})^2 \cdot [1 - \lambda \cdot (V_{DS} - V_{eff})]$$

where:

$I_D$, K, W, L, $V_{TH}$, $V_{DS}$, and $V_{eff}$ are as before, but correspond to transistors M3 and M4;

$V_{GS\_HCD}$ is the gate-source voltage of the high current density transistor M1 or M2 in sense element 310 or 312. Here, $V_{GS\_HCD}$ corresponds to sense signal 242 (nmos_vt) or 240 (pmos_k), as adjusted by the resistive voltage divider (R1,R2, or R3,R4).

Neglecting channel length modulation effects for mathematical convenience:

$$I_D = \frac{K}{2} \cdot \frac{W}{L} \cdot (V_{GS\_HCD} - V_{TH})^2$$

Solving for K:

$$K = (2I_D) \cdot \left(\frac{L}{W}\right) \cdot \frac{1}{(V_{GS\_HCD} - V_{TH})^2}$$

In the above expression for K, $I_D$ is predetermined, that is it is known from accurate design of current mirrors in the bias circuit that supply bias currents to the sense elements. W and L are predetermined, that is, known from the design layout. $V_{TH}$ can be determined as described above based on sense signals 238 (nmos_vt) or 236 (pmos_vt). $V_{GS\_HCD}$ is the sense voltage from transistor M1 or M2, in sense element 314 or 316. Thus, K can be determined.

Thus, monitoring processor 770 determines the transconductance parameter K in a two step process. First, process monitor 102 determines the gate-to-source threshold voltage $V_{TH}$ of a transistor constructed on IC chip 103, based on sense signal 238 or 236. Next, process monitor 102 determines the transconductance parameter K of a transistor constructed on IC chip 103 based on the determined threshold voltage $V_{TH}$ and sense signal 242 or 240.

2.1.4 Determining Small-Signal Transconductance $g_m$

Process monitor module 182 and monitoring processor 770 can be used to determine the small-signal transconductance $g_m$ of a transistor constructed on IC chip 103 (e.g., in one of sense elements 310-316, or in operational circuit 116). The transconductance $g_m$ of the transistor is given by the following general expression.

$$g_m = \sqrt{2K\left(\frac{W}{L}\right) \cdot |I_D|}$$

where:

$g_m$ is the small-signal transconductance of the transistor;
K is the transconductance parameter;
W is the width of the transistor;
L is the channel length of the transistor; and
$I_D$ is the drain current.

Assume W, L and $I_d$ have predetermined or known values. Then, $g_m$ can be determined once K is determined. In an example, assume a composite transistor is constructed on IC chip. The composite transistor is constructed using m=32 unit transistors. Then, the composite transistor is a thirty-two (32) gate device, where each gate has a unit width of 5 um. Also, assume the composite transistor is a 0.35 micron device, that is, that the length L=0.35 um. Also, assume that the composite transistor operates at a drain current of $I_D$=16 mA. From these parameters and a determined value of K from above, we find the small signal transconductance $g_m$ of the composite transistor as follows:

$$g_m = \sqrt{\frac{2 \cdot (1.602 \cdot 10^{-3}) \cdot }{\left(\frac{32 \cdot 5 \text{ um}}{0.35 \text{ um}}\right) \cdot (16 \text{ mA})}} = 0.153 \text{ S} = 153 \text{ mS}$$

The examples given above apply to CMOS processes. Similar circuits and analysis can be applied to other processes. For example, in a Silicon-Germanium (SiGe) or other bipolar process, circuits and methods along the lines of those described above may be used to sense/determine/analyze a base-to-emitter voltage and a collector current instead a gate-to-source voltage and a drain current.

2.2 Compensation Methods

Figure 11:
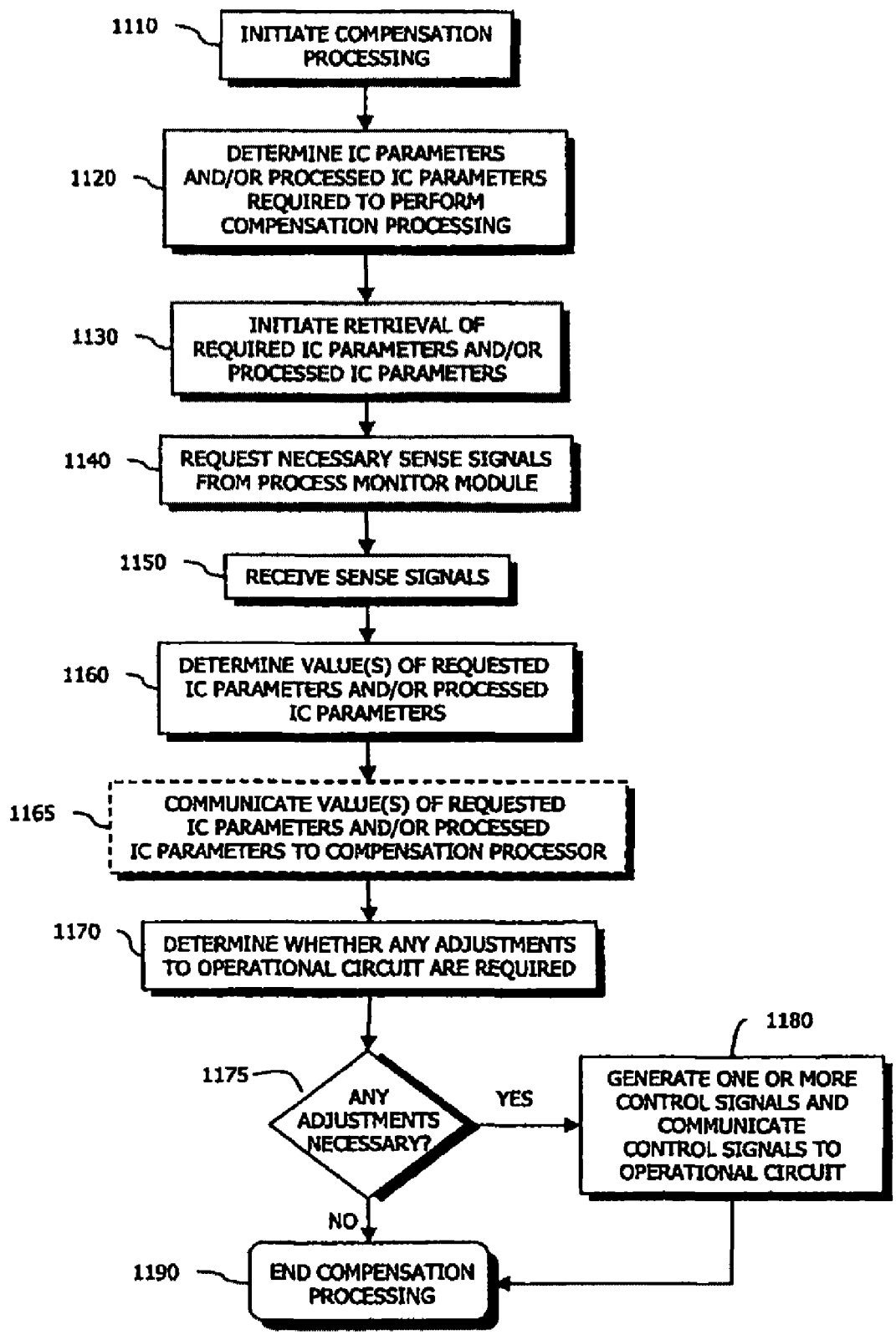
FIG. 11 is a flowchart of a method of monitoring and compensating performance of an operational circuit, according to embodiments of the present invention.

FIG. 11 is a flowchart of a method 1100 for compensation of an operational circuit 116, according to an embodiment of the present invention. Method 1100 will be described with continued reference to FIGS. 1 and 7. Note that some steps shown in the flowchart do not necessarily have to occur in the order shown.

Method 1100 begins with step 1110. In step 1110, compensation processing is initiated for a specific operational circuit 116. Note that compensation processing can be used to compensate for one or more variables associated with the type and/or configuration of the operational circuit 116 being evaluated. In an embodiment of the present invention, compensation processing is performed for one or more variables during method 1100. In an embodiment of the present invention, compensation processor 780 includes logic that periodically initiates compensation processing. For example, compensation processor 780 may automatically initiate compensation processing after a predetermined interval has passed (e.g., every 15 minutes) or upon occurrence of a certain condition. In addition or alternatively, compensation processing may be initiated when operational circuit 116 is powered. In an embodiment of the present invention, compensation processing may also be initiated manually via an optional user interface (not shown) to controller 114.

In step 1120, compensation processor 780 determines the IC parameters and/or processed IC parameters required to perform compensation processing for operational circuit 116.

In step 1130, compensation processor 780 initiates retrieval of the required IC parameters and/or processed IC parameters. In an embodiment of the present invention, compensation processor 780 requests the IC parameters and/or processed IC parameters from monitoring processor 770. Monitoring processor 770 then determines the sense signals 230 necessary to determine the requested IC parameters and/or processed IC parameters. In an embodiment, compensation processor 780 determines the sense signals 230 necessary to determine the requested IC parameters and/or processed IC parameters.

In step 1140, controller 114 then requests (via compensation processor 780, monitoring processor 770 and/or communications control module 790) the necessary sense signals from process monitor module 182.

In step 1150, the requested sense signals are received at controller 114. The sense signals can be received in parallel or serially.

In step 1160, value(s) of one or more IC parameter(s) and/or processed IC parameter(s) are determined as described above in reference to step 808 in FIG. 8. In an embodiment, this step is performed in monitoring processor 770. In addition or alternatively, this step is performed in compensation processor 780.

In optional step 1165, the value(s) of the requested circuit parameter(s) and/or processed circuit parameter(s) are communicated to compensation processor 780. Note that this step is not required in an embodiment where compensation processor 780 determines the value(s) of the parameters in step 1160.

In step 1170, compensation processor determines whether any adjustments to operational circuit 116 are required.

In step 1175, compensation processor 780 determines whether any adjustments to operational circuit 116 are indicated in step 1170. If it is determined in step 1175 that adjustments are indicated, processing proceeds to step 1180. If it is determined in step 1175 that no adjustments are indicated, processing proceeds to step 1190.

In step 1180, compensation processor 780 generates one or more digital control signals 120 containing the required adjustments and controller 114 (via compensation processor 780 or communications control module 790) communicates the control signal(s) to operational circuit 116. The operational circuit 116 uses the one or more control signals 120 to make adjustments to the operational circuit to compensate for detected deviations.

In step 1190, compensation processing ends.

Figure 12:
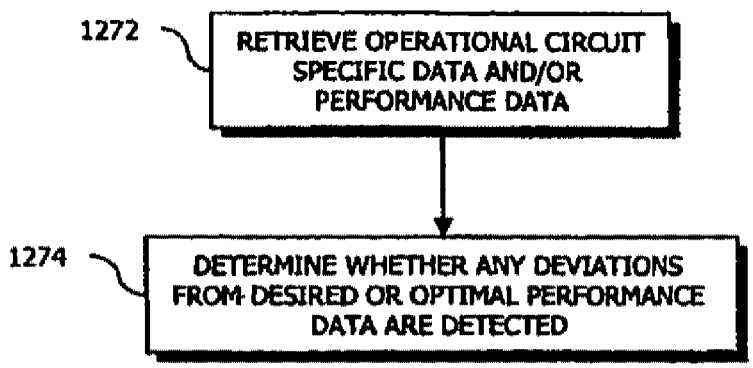
FIG. 12 depicts a flowchart for determining whether any adjustments are necessary to an operational circuit, in an embodiment of the present invention.

FIG. 12 depicts a flowchart for determining whether any adjustments are necessary to operational circuit 116, in an embodiment of the present invention of step 1170.

In step 1272, compensation processor 770 retrieves operational circuit specific data and/or performance data from memory 785.

In step 1274, compensation processor 770 determines, based on the values of the circuit parameters and/or processed circuit parameters and the operational circuit specific data, whether any deviations from desired or optimal performance data are detected. If deviations are detected, compensation processor 770 then determines whether the deviations require adjustments to be made to the operational circuit.

Figure 13:
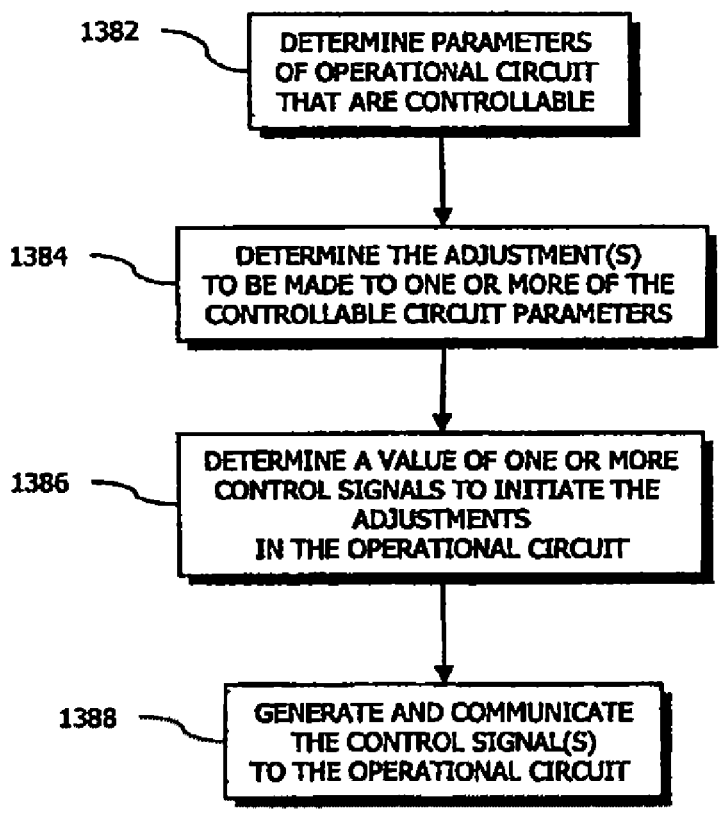
FIG. 13 depicts a flowchart for generating a control signal indicative of the required adjustments, in an embodiment of the present invention.

FIG. 13 depicts a flowchart for generating a control signal indicative of the required adjustments, in an embodiment of the present invention of step 1180.

In step 1382, compensation processor 770 determines the parameters of operational circuit 116 that are controllable. This step could be performed by retrieving data from memory 785. In addition or alternatively, this step could be integrated into the compensation processing logic.

In step 1384, compensation processor 770 determines the adjustment(s) to be made to one or more of the controllable circuit parameters.

In step 1386, compensation processor 770 determines a value of one or more control signals to initiate the adjustments in the operational circuit.

In step 1388, controller 114 generates and communicates the control signal(s) to the operational circuit 116.

2.2.1 Load Resistance Adjustment

Figure 14:
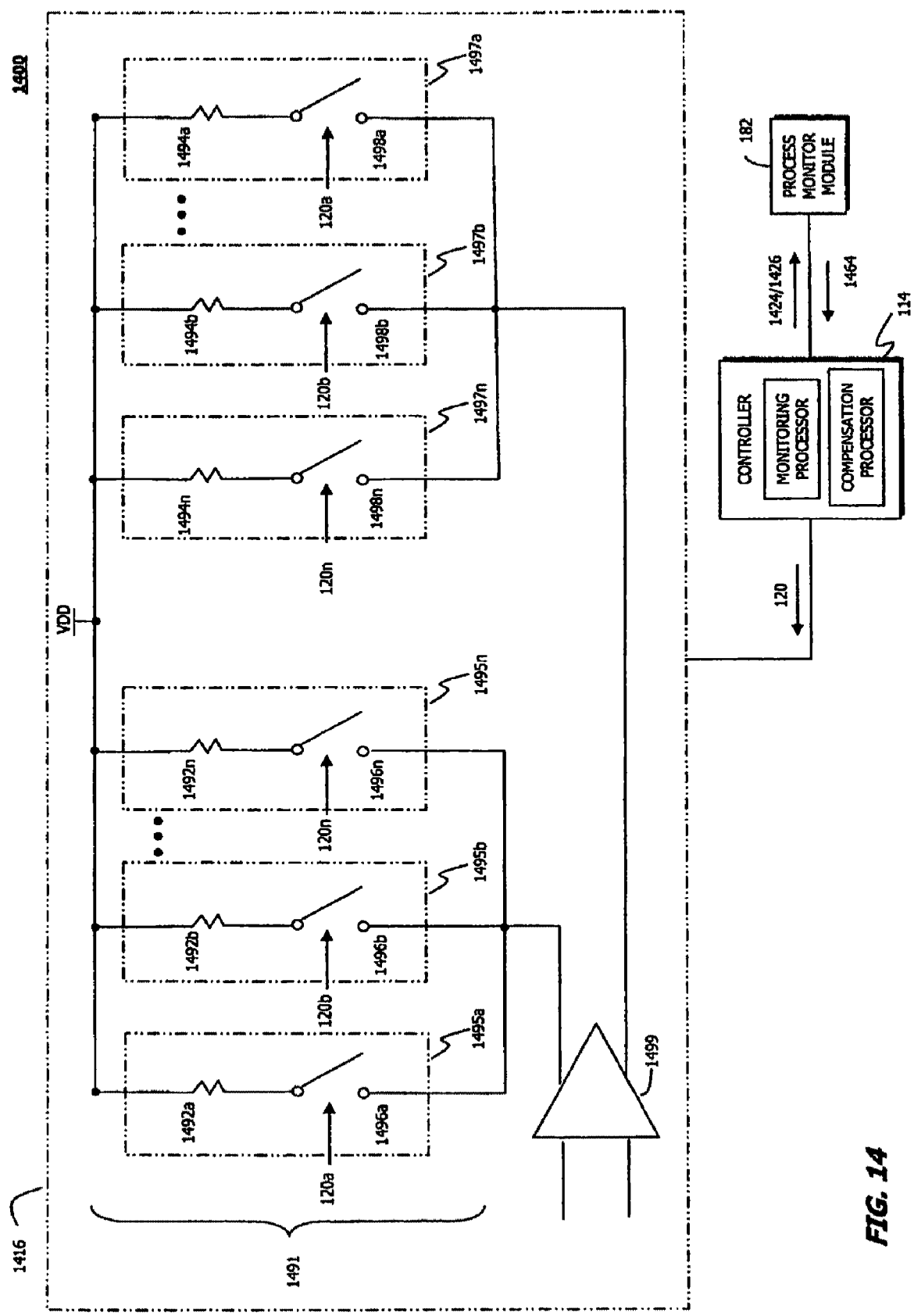
FIG. 14 is a block diagram of an exemplary operational circuit having digitally controllable resistance, according to embodiments of the present invention.

FIG. 14 is a block diagram of a system 1400 for adjusting load resistance of an exemplary operational circuit, according to embodiments of the present invention. System 1400 includes an exemplary operational circuit 1416, process monitor module 182, and controller 114. Exemplary operational circuit 1416 includes an amplifier 1499 and a load circuit 1491. The value of resistance in load circuit 1491 is digitally controllable.

Load circuit 1491 includes a first plurality of parallel resistance stages 1495a-1495n. Each resistance stage 1495 includes a resistor 1492 coupled between supply voltage $V_{DD}$ and a switch 1496. Load circuit 1491 also includes a second plurality of parallel resistance stages 1497a-1497n. Each resistance stage 1497 includes a resistor 1494 coupled between supply voltage $V_{DD}$ and a switch 1498. Individual resistance stages 1495 and/or 1497 are switched in or out in response to control signal(s) received from controller 114. Thus, the total value of resistance of the load circuit can be adjusted by the digital control signals.

In an embodiment of the present invention, switches 1496a-1496n and 1498a-1498n are transistors. As would be appreciated by persons skilled in the relevant art(s), other types of switches could be used with the present invention.

Switches 1496a-1496n and 1498a-1498n receive one or more components of control signal 120 from compensation processor 780. For example, switches 1496a and 1498a receive component 120a; switches 1496b and 1498b receive component b; and switches 1496n and 1498n receive component n. The components of control signal 120 operate to turn the associated switches on or off. For example, when component 120a turns switches 1496a and 1498a on, resistors 1492a and 1494a are coupled in parallel between $V_{DD}$ and amplifier 1499. Additional resistors can be coupled in parallel by closing their respective switches.

In an embodiment, compensation processor 780 initiates compensation processing for operational circuit 1416. Compensation processing may evaluate the voltage gain of amplifier 1499 and/or the absolute resistance of the load circuit 1491. To perform this evaluation, controller 114 requests the necessary sense elements from process monitor module 182 using select signals 1424/1426. For example, the absolute value of resistors used in load circuit 1491 can be determined by monitoring the absolute value of a reference resistor. The absolute value of load resistance in load circuit 1491 can be derived from sense signals indicative of the high and/or low sheet-rho of the IC chip and the transconductance, $G_m$, of the circuit. The transconductance, $G_m$, can be derived from transconductance parameter, K, which can be derived from sense signals indicative of threshold voltage and/or gate-source voltage of transistors constructed on the IC chip.

Using the values received from process monitor module 182 in the digital signal(s), controller 114 determines the value of the circuit parameters and/or processed circuit parameters needed to perform the compensation algorithm. The compensation processor uses these values to determine the deviation from the desired resistance of the load circuit and/or the deviation from desired voltage gain. If the deviation is large enough to require compensation, the compensation processor 780 then determines the combination of resistance stages to switch in (or out) to obtain the desired resistance and/or voltage gain for load circuit 1491. The compensation processor 780 then generates one or more digital control signals to initiate the adjustments to operational circuit 1416. Controller 114 communicates the control signal(s) to operational circuit 1416. The digital control signal contains one or more digital components to control the switches in the resistance stages, as described above.

2.2.2 Capacitance Adjustment

Figure 15:
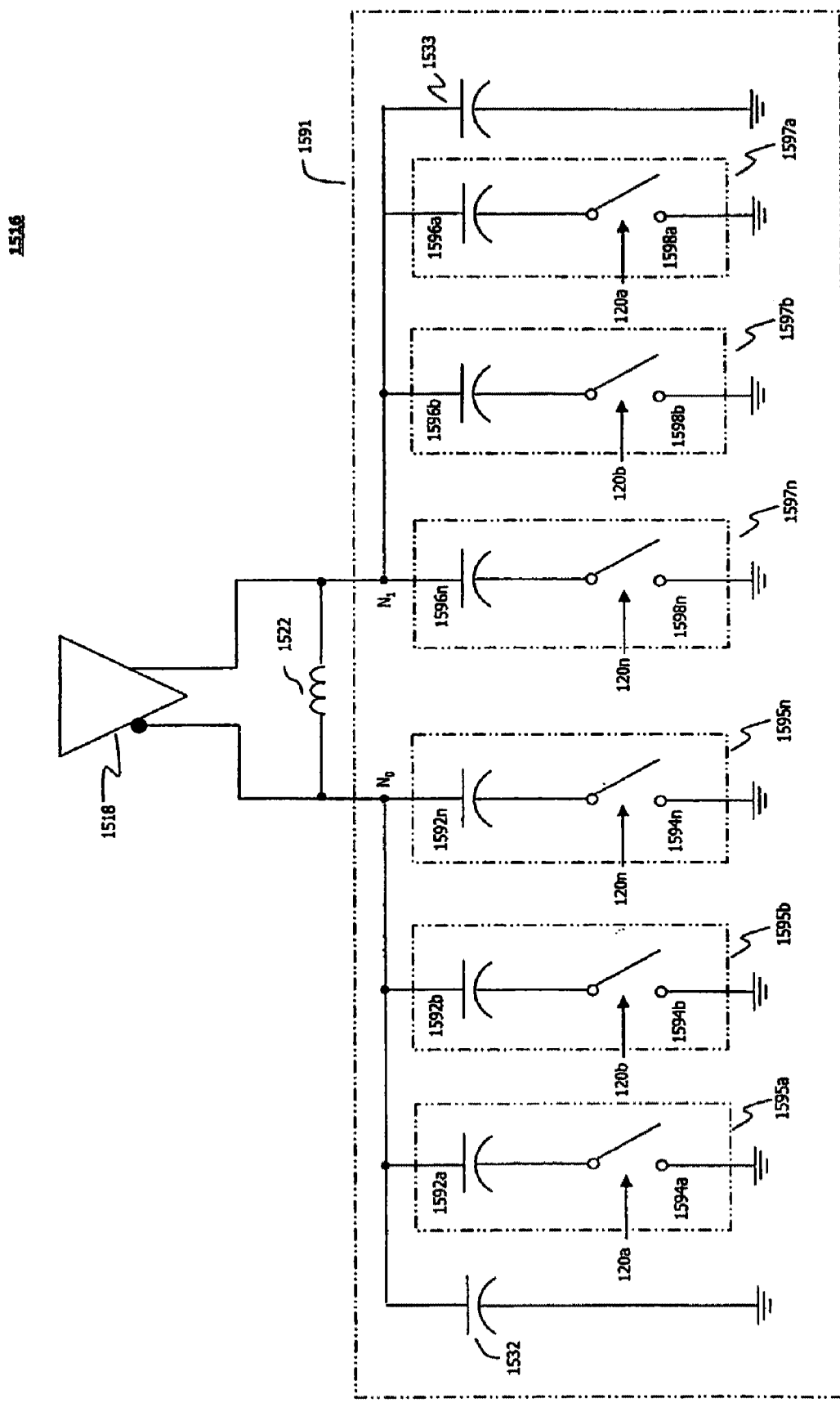
FIG. 15 is a block diagram of an exemplary operational circuit having digitally controllable capacitance, according to embodiments of the present invention.

FIG. 15 is a block diagram of an exemplary operational circuit 1516 having digitally controllable capacitance, according to embodiments of the present invention. Operational circuit 1516 includes an amplifier 1518, an inductor 1522, and a capacitance portion 1591.

Operational circuit 1516 may be a component of a circuit that has a frequency dependence, such as a filter or an oscillator. Because inductors are area intensive, it is desirable to fine tune circuits such as operational circuit 1516 by adjusting the capacitance of capacitance section 1591. In another embodiment, operational circuit may be a component of a circuit such as a relaxation oscillator which oscillates at a frequency determined by a charge/discharge current, capacitor value, and threshold voltages. Standard IC design techniques allow for obtaining accurate absolute currents and accurate absolute threshold voltages. In these applications, the ability to adjust the oscillator capacitor(s) to obtain greater accuracy is desirable.

Capacitance portion 1591 includes a bulk capacitance 1532 and 1533, a first plurality of parallel capacitance stages 1595a-1595n, and a second plurality of parallel capacitance stages 1597a-1597n. Each capacitance stage 1595 includes a capacitor 1592 coupled between node $N_0$ and a switch 1594. Each capacitance stage 1597 also includes a capacitor 1596 coupled between node $N_1$ and a switch 1598. Individual capacitance stages are switched in or out in response to control signal(s) received from a controller (not shown). Thus, the total value of capacitance of the capacitance portion can be adjusted by the digital control signals.

Inductor 1522 is coupled between nodes $N_0$ and $N_1$. The resonant frequency of the operational circuit is proportional to the square root of the inverse of the inductance of inductor 1522 multiplied by the capacitance of capacitance portion 1591.

In an embodiment of the present invention, switches 1594a-1594n and 1598a-1598n are transistors. As would be appreciated by persons skilled in the relevant art(s), other types of switches could be used with the present invention.

Switches 1594a-1594n and 1598a-1598n receive one or more components of control signal 120. For example, switches 1594a and 1598a receive component 120a; switches 1594b and 1598b receive component b; and switches 1594n and 1598n receive component n. The components of control signal 120 operate to turn the associated switches on or off. For example, when component 120a turns switches 1594a and 1598a on, capacitors 1592a and 1596a are coupled in parallel with bulk capacitors 1532 and 1533. Additional capacitors can be coupled in parallel by closing their respective switches.

In an embodiment, compensation processor (not shown) initiates compensation processing to determine whether a frequency of operational circuit 1516 is in a nominal range of operation. To perform this evaluation, the controller requests the necessary sense elements from the process monitor module constructed on the same IC as operational circuit 1516. Using the values received from process monitor module, the controller determines whether any fine tuning of the circuit is required. If fine tuning is required, the compensation processor then determines the combination of capacitance stages to switch in (or out) to obtain the desired capacitance for capacitance portion 1591. The compensation processor 780 then generates one or more digital control signals 120 and the controller communicates the control signal(s) to operational circuit 1516. The digital control signal 120 contains one or more digital components to control the switches in the capacitance stages, as described above.

2.2.3 Bias Current Adjustment

Some operational circuits must contend with large signal swings. When signal levels are large, unwanted limiting action can occur, resulting in excess distortion in certain circuits such as amplifiers. This unwanted limiting action can be prevented by adjusting the bias on the operational circuit to account for process variations.

Figure 16:
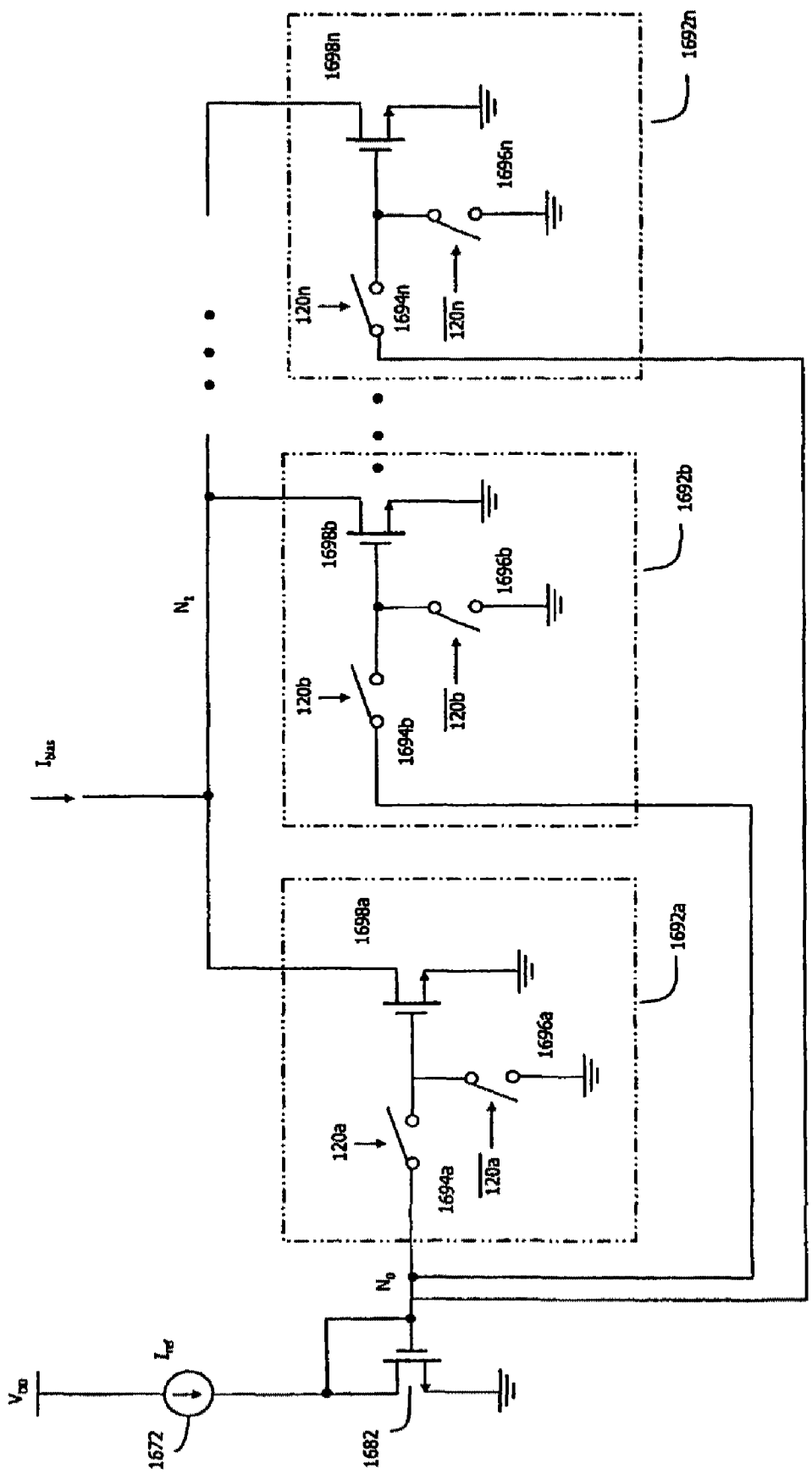
FIG. 16 is a block diagram of an exemplary operational circuit having digitally controllable current sources, according to embodiments of the present invention.

FIG. 16 is a block diagram of an exemplary operational circuit 1616 having digitally controllable bias current sources, according to embodiments of the present invention. Operational circuit 1616 includes a reference current source 1672, a diode connected transistor 1682, and a plurality of current stages 1692a-1692n.

Each current stage 1692 includes a transistor 1698, a first switch 1694 coupled between node $N_0$ and the gate of transistor 1698, and a second switch 1696 coupled between the gate of transistor 1698 and ground. The drain of transistor 1698 is coupled to node $N_1$ and the source of transistor 1698 is coupled to ground. Individual current stages are switched in or out in response to control signal(s) received from a controller (not shown). Thus, the total value of the bias current can be adjusted by the digital control signals.

In an embodiment of the present invention, switches 1694a-1694n and 1696a-1696n are transistors. As would be appreciated by persons skilled in the relevant art(s), other types of switches could be used with the present invention.

Switches 1694a-1694n receive one or more components of control signal 120 and switches 1696a-1696n receive the inverse of the control signal component received at switch

1694a-1694n. For example, switch 1694a receives component 120a and switch 1696a receives the inverse of component 120a; switch 1694b receives component 120b and switch 1696b receives the inverse of component 120b; and switch 1694n receives component 120n and switch 1696n receives the inverse of component 120n. The components of control signal 120 operate to turn the associated switches on or off. For example, when component 120a turns switch 1694a on and switch 1696a off, the gate of diode connected transistor 1682 is coupled to the gate of transistor 1698a (creating a current mirror). The gates of transistors 1698b in additional current stages can be coupled to the gate of transistor 1682 in a similar manner.

In an embodiment, the compensation processor (not shown) initiates compensation processing to compensate for deviations in the threshold voltage ($V_T$) of the device. For example, an increase in $V_T$ of the device could result in reduced linearity and create excessive distortion. To perform this evaluation, the controller requests the necessary sense elements from the process monitor module on the same IC as operational circuit 1616 and calculates $V_T$. Using the values received from the process monitor module, the controller determines whether any adjustments to operational circuit 1616 are required. For example, if $V_T$ has increased, the controller can adjust the bias current in order to increase the gate overdrive of the device. If adjustments are required, the compensation processor determines the combination of current stages 1692 to switch in (or out) to obtain the desired bias current. The compensation processor 780 then generates one or more digital control signals 120 and the controller communicates the control signal(s) to operational circuit 1616. The digital control signal 120 contains one or more digital components to control the switches in the current stages.

In another embodiment, the compensation processor (not shown) initiates compensation processing to compensate for deviations from nominal small signal transconductance $g_m$. To perform this evaluation, the controller requests the necessary sense elements from the process monitor module on the same IC as operational circuit 1616 and calculates the small signal transconductance $g_m$ as described in section 2.1.4. Using the values received from the process monitor module, the controller determines whether any adjustments to operational circuit 1616 are required. For example, if $g_m$ is lower than nominal, then the controller can increase the current by switching in more current stages 1692 to increase the $g_m$. If adjustments are required, the compensation processor determines the combination of current stages 1692 to switch in (or out) to obtain the desired bias current. The compensation processor 780 then generates one or more digital control signals 120 and the controller communicates the control signal(s) to operational circuit 1616. The digital control signal 120 contains one or more digital components to control the switches in the current stages.

2.2.4 Voltage Threshold Adjustment

FIG. 17 is a block diagram of a system for adjusting the threshold voltage of a comparator in an operational circuit 1716, according to embodiments of the present invention. Operational circuit 1716 includes an adjustable amplifier 1798, a power detector 1792, a threshold comparator 1794, and a control circuit 1796 coupled together to form a feedback loop for automatically adjusting the gain of amplifier 1798.

The output of amplifier 1798 is coupled to power detector 1792. Power detector 1792 receives the output from the amplifier 1798 and generates voltage amplitude proportional to peak, average, or RMS power, dependent upon the automatic gain control (AGC) scheme used. The proportional voltage amplitude is then communicated to the threshold comparator 1794. The threshold comparator includes a digitally controllable threshold voltage. The comparator compares the signal from the power detector with the threshold voltage and generates an output based on whether the signal voltage is greater or less than the threshold voltage. In an embodiment of the present invention, threshold comparator 1794 includes three comparators for comparing the power detector output to a high level threshold, a mid level threshold, and a low level threshold. In further embodiments, threshold comparator 1794 may include any number of comparators or an n-bit analog to digital converter, used to digitize the output to a certain number of bits. The control circuit 1796 reads the output of threshold comparator 1794 and adjusts the amplifier accordingly.

Operational circuit 1716 is included on the same IC 1703 as process monitor module 182. In an embodiment, the compensation processor (not shown) initiates compensation processing to compensate for deviations in a threshold voltage used by threshold comparator 1794. To perform this evaluation, the controller requests the necessary sense elements from the process monitor module. Using the values received from process monitor module, the controller determines whether any adjustments to the threshold voltage of the comparator are required. If adjustments are required, the compensation processor determines a value for the control signal to adjust the threshold voltage to the new value. The compensation processor 780 then generates one or more digital control signals 120 and the controller communicates the control signal(s) to threshold comparator 1794.

For example, threshold comparator 1794 may include a register for controlling a threshold voltage. When driven by a calibrated input signal, threshold voltage of 1.0 V may be represented in the register as a digital value of 1 0 0 0. If the operational circuit has an error, the circuit may produce a threshold voltage that is 1.1V (i.e., 10% too high). The controller 114 identifies the deviation in the threshold voltage and communicates a control signal to reset the register in the threshold comparator to adjust the voltage according (e.g., sends a digital value of 0 1 1 1).

In another embodiment, the compensation processor (not shown) initiates compensation processing to compensate for deviations in the output of power detector 1792. To perform this evaluation, the controller requests the necessary sense elements from the process monitor module. Using the values received from process monitor module, the controller determines whether any adjustments to the output of the power detector are required. If adjustments are required, the compensation processor determines a value for the control signal to adjust the output of the power detector to the new value. The compensation processor 780 then generates one or more digital control signals 120 and the controller communicates the control signal(s) to power detector 1792.

4. Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

The present invention has been described above with the aid of functional building blocks and method steps illustrating the performance of specified functions and relationships thereof. The boundaries of these functional building blocks and method steps have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks and modules can be implemented by discrete components including digital and/or analog circuits, application specific integrated circuits, processors executing appropriate software, hardware, firmware and the like or any combination thereof.

What is claimed is:

1. A method performed in a controller for adjusting an operational circuit constructed on an integrated circuit chip, comprising:

receiving, from a process monitor, data representative of a set of measured process-dependent parameters of the operational circuit;

selecting a parameter in the set of measured process-dependent parameters of the operational circuit that are externally controllable;

evaluating, at the controller, the performance of the operational circuit to determine an adjustment to the selected parameter of the operational circuit, based on the received data; and communicating control data to the operational circuit, wherein the control data initiates the adjustment to the operational circuit.

2. The method of claim 1, further comprising:
retrieving the set of parameters for the operational circuit that are controllable.

3. The method of claim 1, further comprising:
determining data required to evaluate the performance of the operational circuit.

4. The method of claim 3, further comprising:
requesting a set of the data required to evaluate the performance of the operational circuit from the process monitor.

5. The method of claim 4, further comprising:
retrieving a second set of the data required to evaluate the performance of the operational circuit from a memory.

6. The method of claim 1, wherein the receiving comprises:
receiving, from a process monitor at least partially constructed on the integrated circuit chip, the data representative of the set of measured process-dependent parameters of the operational circuit.

7. The method of claim 1, wherein the receiving comprises:
receiving, from a process monitor constructed on the integrated circuit chip, the data representative of the set of measured process-dependent parameters of the operational circuit.

8. The method of claim 1, wherein the receiving comprises:
receiving, from the process monitor, the data representative of the set of measured process-dependent parameters of the operational circuit, and data representative of an environmental condition of the operational circuit.

9. The method of claim 1, wherein the receiving comprises:
receiving, from the process monitor, the data representative of the set of measured process-dependent parameters of the operational circuit, and data representative of an operational condition of the integrated circuit chip.

* * * * *